(12) United States Patent
Sarayama et al.

(10) Patent No.: US 8,591,647 B2
(45) Date of Patent: *Nov. 26, 2013

(54) PRODUCTION OF A GAN BULK CRYSTAL SUBSTRATE AND A SEMICONDUCTOR DEVICE FORMED THEREON

(75) Inventors: Seiji Sarayama, Miyagi (JP); Masahiko Shimada, Miyagi (JP); Hisanori Yamane, Miyagi (JP); Hirokazu Iwata, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 700 days.

This patent is subject to a terminal disclaimer.

(21) Appl. No.: 12/367,013

(22) Filed: Feb. 6, 2009

(65) Prior Publication Data

US 2009/0173274 A1    Jul. 9, 2009

Related U.S. Application Data

(60) Continuation of application No. 11/408,656, filed on Apr. 20, 2006, now Pat. No. 7,508,003, which is a continuation of application No. 10/601,301, filed on Jun. 13, 2003, now Pat. No. 7,250,640, which is a division of application No. 09/590,063, filed on Jun. 8, 2000, now Pat. No. 6,592,663.

(30) Foreign Application Priority Data

Jun. 9, 1999  (JP) ...................... 11-162411
Aug. 24, 1999 (JP) ...................... 11-237195
Sep. 29, 1999 (JP) ...................... 11-277045
Oct. 18, 1999 (JP) ...................... 11-295039

(51) Int. Cl.
*H01L 21/322*    (2006.01)

(52) U.S. Cl.
USPC .......................................... 117/68

(58) Field of Classification Search
USPC ............... 117/68, 13, 73, 74, 75, 77, 78, 223, 117/224, 952; 423/409
See application file for complete search history.

(56) References Cited

U.S. PATENT DOCUMENTS

| 4,875,967 A | * | 10/1989 | Mishima et al. ............... 117/78 |
| 5,584,929 A | | 12/1996 | Kawase |
| 5,679,152 A | | 10/1997 | Tischler et al. |
| 5,714,006 A | | 2/1998 | Kizuki et al. |

(Continued)

FOREIGN PATENT DOCUMENTS

| JP | 50-149270 | 11/1975 |
| JP | 56-160400 | 12/1981 |

(Continued)

OTHER PUBLICATIONS

Grzegory et al., "III-V Nitrides-Thermodynamics and Crystal Growth at High N2 Pressure," 1995, J. Phys. Chem. Solids, vol. 56, No. 3/4, pp. 639-647.*

(Continued)

*Primary Examiner* — Melvin C Mayes
*Assistant Examiner* — Stefanie Cohen
(74) *Attorney, Agent, or Firm* — Cooper & Dunham LLP

(57) ABSTRACT

A method is provided for producing a single crystal body of a group III nitride, comprising the steps of forming a molten flux of a volatile metal in a reaction vessel and causing a growth of a GaN single crystal from the molten flux, wherein the growth is continued while replenishing a compound containing N from a source outside the reaction vessel, and wherein a seed crystal is disposed in the reaction vessel.

19 Claims, 21 Drawing Sheets

(56) References Cited

U.S. PATENT DOCUMENTS

| | | | |
|---|---|---|---|
| 5,863,326 A * | 1/1999 | Nause et al. | 117/217 |
| 5,868,837 A | 2/1999 | DiSalvo et al. | |
| 5,962,915 A | 10/1999 | Young et al. | |
| 6,086,672 A * | 7/2000 | Hunter | 117/84 |
| 6,136,626 A | 10/2000 | Kidoguchi et al. | |
| 6,177,057 B1 | 1/2001 | Purdy | |
| 6,270,569 B1 * | 8/2001 | Shibata et al. | 117/68 |
| 6,294,440 B1 | 9/2001 | Tsuda et al. | |
| 6,372,041 B1 | 4/2002 | Cho et al. | |
| 6,398,867 B1 * | 6/2002 | D'Evelyn et al. | 117/11 |
| 6,456,640 B1 | 9/2002 | Okumura | |
| 6,549,552 B1 | 4/2003 | Omi et al. | |
| 6,592,663 B1 | 7/2003 | Sarayama et al. | |
| 6,842,470 B2 | 1/2005 | Omi et al. | |
| 7,250,640 B2 | 7/2007 | Sarayama et al. | |
| 2007/0012239 A1 | 1/2007 | Sarayama et al. | |

FOREIGN PATENT DOCUMENTS

| | | |
|---|---|---|
| JP | 4-114991 | 4/1992 |
| JP | 7-273048 | 10/1995 |
| JP | 7-300385 | 11/1995 |
| JP | 9-110576 | 4/1997 |
| JP | 10-7496 | 1/1998 |
| JP | 10007496 * | 1/1998 |
| JP | 10-67592 | 3/1998 |
| JP | 11-1395 | 1/1999 |
| JP | 11-60394 | 3/1999 |
| JP | 11-87850 | 3/1999 |
| JP | 11-171699 | 6/1999 |
| JP | 11-189498 | 7/1999 |
| JP | 2001-58900 | 3/2001 |

OTHER PUBLICATIONS

Yamane et al., "Preparation of GaN Single Crystals Using a Na Flux," 1997, Chem. Mater., 9, pp. 413-416.*

Yamane et al., "Morphology and characterization of GaN single crystals grown in a Na flux," 1998, Journal of Crystal Growth, 186, pp. 8-12.*

Anonymous submission of information in corresponding Japanese application No. JP11-277045 and English translation thereof.

Japanese official action dated Feb. 28, 2006.

Nakamura, S., et al., "InGaN/GaN/AlGaN-Based Laser Diodes With Modulation-Doped Strained-Layer Superlattices", *Japanese Journal of Applied Physics*, 1997, vol. 36, No. 12A, pp. 1568-1571.

Nakamura, S., et al., "InGaN/GaN/AlGaN-Based Laser Diodes With Cleaved Facets Grown on GaN Substrates", *Applied Physics Letters*, 1998, vol. 73, No. 6, pp. 832-834.

Orton, J.W., et al., "Group III nitride semiconductors for short wavelength light-emitting devices", 1998, *Reports on Progress in Physics*, 61, pp. 1-75.

Porowski, S., "Bulk and Homoepitaxial GaN-growth and Charactacterisation", *Journal of Crystal Growth*, 1998, vol. 189/190, pp. 153-158.

Shibata, T., et al., "Hydride vapor-phase epitaxy growth of high-quality GaN bulk single crystal By epitaxial lateral overgrowth", *Journal of Crystal Growth*, 1998, vol. 189/190, pp. 67-71.

Yamane, H., et al., "Preparation of GaN Single Crystals Using a Na Flux", *Chemical Matter*, 1997, vol. 9, No. 2, pp. 413-416.

Yamane, Hisanori, et al., "Morphology and characterization of GaN single crystals grown in a Na flux," *Journal of Crystal Growth*, 1998, vol. 186, pp. 8-12.

Japanese official action in connection with a counterpart Japanese patent application No. 2006-172448.

Yamane, Hisanori, et al., "Growth of GaN Single Crystals Using Na Flux," vol. 25., No. 4., pp. 152-156, 1998 (and English translation thereof).

May 11, 2010—Japanese official action in corresponding Japanese patent application No. 2007-022916.

Oct. 26, 2010 Japanese official action in connection with a counterpart Japanese patent application.

* cited by examiner

FIG.15A
FIG.15B
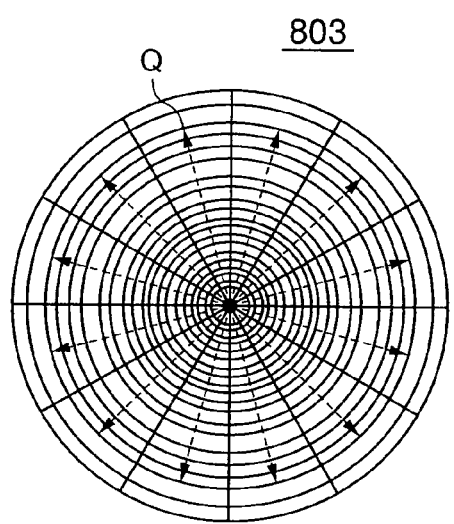
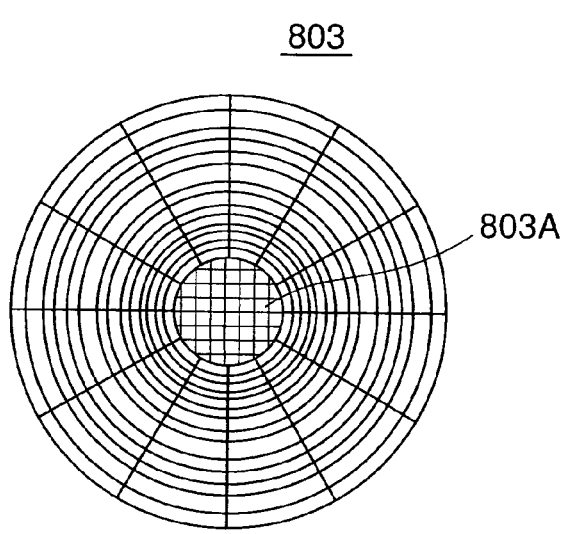

FIG.19

| h | k | l | 10Fc | 10Fo | 10s |
|---|---|---|------|------|-----|
| -1 | 1 | 1 | 1012 | 1028 | 6 |
| 1 | 1 | 1 | 1035 | 1026 | 7 |
| 0 | 0 | 2 | 795 | 759 | 4 |
| 0 | 2 | 2 | 944 | 972 | 5 |
| -1 | 1 | 3 | 762 | 775 | 4 |
| 1 | 1 | 3 | 746 | 766 | 5 |
| -2 | 2 | 2 | 630 | 632 | 7 |
| 2 | 2 | 2 | 630 | 629 | 7 |
| 0 | 0 | 4 | 726 | 718 | 7 |
| -1 | 3 | 3 | 594 | 584 | 5 |
| 1 | 3 | 3 | 608 | 592 | 7 |
| 0 | 2 | 4 | 510 | 518 | 4 |
| -2 | 2 | 4 | 594 | 595 | 7 |
| 2 | 2 | 4 | 594 | 599 | 9 |
| -1 | 1 | 5 | 491 | 483 | 9 |
| 1 | 1 | 5 | 505 | 489 | 8 |
| -3 | 3 | 3 | 505 | 535 | 14 |
| 3 | 3 | 3 | 491 | 533 | 24 |
| 0 | 4 | 4 | 508 | 499 | 9 |

PRODUCTION OF A GAN BULK CRYSTAL SUBSTRATE AND A SEMICONDUCTOR DEVICE FORMED THEREON

CROSS-REFERENCE TO RELATED APPLICATION

This application is a Rule 1.53(b) continuation of Ser. No. 11/408,656, filed Apr. 20, 2006, now U.S. Pat. No. 7,508,003, which in turn is a continuation and claims priority of Ser. No. 10/601,301, filed Jun. 13, 2003, now U.S. Pat. No. 7,250,640, which in turn is a divisional of Ser. No. 09/590,063, filed Jun. 8, 2000, now U.S. Pat. No. 6,592,663, the entire contents of each of which are incorporated herein by reference.

BACKGROUND

This disclosure generally relates to semiconductor devices and more particularly to a semiconductor device having a GaN bulk crystal substrate.

GaN is a III-V compound semiconductor material having a large bandgap of blue to ultraviolet wavelength energy. Thus, intensive investigations are being made with regard to development of optical semiconductor devices having a GaN active layer for use particularly in optical information storage devices including a digital video data recorder (DVD). By using such a light emitting semiconductor device producing blue to ultraviolet wavelength optical radiation for the optical source, it is possible to increase the recording density of optical information storage devices.

Conventionally, a laser diode or light-emitting diode having a GaN active layer has been constructed on a sapphire substrate in view of the absence of technology of forming a GaN bulk crystal substrate.

FIG. 1 shows the construction of a conventional GaN laser diode according to Nakamura, S., et al., Jpn. J. Appl. Phys. vol. 36 (1997) pp. L1568-L1571, Part 2, No. 12A, 1 Dec. 1997, constructed on a sapphire substrate 1.

Referring to FIG. 1, the sapphire substrate 1 has a (0001) principal surface covered by a low-temperature GaN buffer layer 2, and includes a GaN buffer layer 3 of n-type grown further on the buffer layer 2. The GaN buffer layer 3 includes a lower layer part 3a and an upper layer part 3b both of n-type, with an intervening $SiO_2$ mask pattern 4 provided such that the $SiO_2$ mask pattern 4 is embedded between the lower layer part 3a and the upper layer part 3b. More specifically, the $SiO_2$ mask pattern 4 is formed on the lower GaN buffer layer part 3a, followed by a patterning process thereof to form an opening 4A in the $SiO_2$ mask pattern 4.

After the formation of the $SiO_2$ mask pattern 4, the upper GaN layer part 3b is formed by an epitaxial lateral overgrowth (ELO) process in which the layer 3b is grown laterally on the $SiO_2$ mask 4. Thereby, desired epitaxy is achieved with regard to the lower GaN layer part 3a at the opening 4A in the $SiO_2$ mask pattern 4. By growing the GaN layer part 3b as such, it is possible to prevent the defects, which are formed in the GaN layer part 3a due to the large lattice misfit between GaN and sapphire, from penetrating into the upper GaN layer part 3b.

On the upper GaN layer 3b, a strained super-lattice structure 5 having an n-type $Al_{0.14}Ga_{0.86}N/GaN$ modulation doped structure is formed, with an intervening InGaN layer 5A of the n-type having a composition $In_{0.1}Ga_{0.9}N$ interposed between the upper GaN layer part 3b and the strained superlattice structure 5. By providing the strained superlattice structure 5 as such, dislocations that are originated at the surface of the sapphire substrate 1 and extending in the upward direction are intercepted and trapped.

On the strained superlattice structure 5, a lower cladding layer 6 of n-type GaN is formed, and an active layer 7 having an MQW structure of $In_{0.01}Ga_{0.98}N/In_{0.15}Ga_{0.85}N$ is formed on the cladding layer 6. Further, an upper cladding layer 8 of p-type GaN is formed on the active layer 7, with an intervening electron blocking layer 7A of p-type AlGaN having a composition of $Al_{0.2}Ga_{0.8}N$ interposed between the active layer 7 and the upper cladding layer 8.

On the upper cladding layer 8, another strained superlattice structure 9 of a p-type $Al_{0.14}Ga_{0.86}N/GaN$ modulation doped structure is formed such that the superlattice structure 9 is covered by a p-type GaN cap layer 10. Further, a p-type electrode 11 is formed in contact with the cap layer 10 and an n-type electrode 12 is formed in contact with the n-type GaN buffer layer 3b.

It is reported that the laser diode of FIG. 1 oscillates successfully with a practical lifetime, indicating that the defect density in the active layer 7 is reduced successfully.

On the other hand, the laser diode of FIG. 1 cannot eliminate the defects completely, and there remain substantial defects particularly in correspondence to the part on the $SiO_2$ mask 4 as represented in FIG. 2. See Nakamura S. et al., op cit. It should be noted that such defects formed on the $SiO_2$ mask 4 easily penetrate through the strained superlattice structure 5 and the lower cladding layer 6 and reach the active layer 7.

In view of the foregoing concentration of the defects in the central part of the $SiO_2$ mask pattern 4, the laser diode of FIG. 1 uses the part of the semiconductor epitaxial structure located on the opening 4A of the $SiO_2$ mask 4, by forming a mesa structure MS in correspondence to the opening 4A. However, the defect-free region formed on the opening 4A has a lateral size of only several microns, and thus, it is difficult to construct a high-power laser diode based on the construction of FIG. 1. When the laser diode of FIG. 1 is driven at a high power, the area of optical emission in the active region extends inevitably across the defects, and the laser diode is damaged as a result of optical absorption caused by the defects. Further, the laser diode of FIG. 1 having such a construction has other various drawbacks associated with the defects in the semiconductor epitaxial layers, such as large threshold current, limited lifetime, and the like. Further, the laser diode of FIG. 1 has a drawback, in view of the fact that the sapphire substrate is an insulating substrate, in that it is not possible to provide an electrode on the substrate. As represented in FIG. 1, it is necessary to expose the top surface of the n-type GaN buffer layer 3 by an etching process in order to provide the n-type electrode 12, while such an etching process complicates the fabrication process of the laser diode. In addition, the increased distance between the active layer 7 and the n-type electrode 12 causes the problem of increased resistance of the current path, while such an increased resistance of the current path deteriorates the high-speed response of the laser diode.

Further, the conventional laser diode of FIG. 1 suffers from the problem of poor quality of mirror surfaces defining the optical cavity. Due to the fact that the sapphire single crystal constituting the substrate 1 belongs to hexagonal crystal system, formation of the optical cavity cannot be achieved by a simple cleaving process. It has been therefore necessary to form the mirror surfaces, when fabricating the laser diode of FIG. 1 by conducting a dry etching process, while the mirror surface thus formed by a dry etching process has a poor quality.

Because of the foregoing reasons, as well as because of other various reasons not mentioned here, it is desired to form the substrate of the GaN laser diode by a bulk crystal GaN and form the laser diode directly on the GaN bulk crystal substrate.

With regard to the art of growing a bulk crystal GaN, there is a successful attempt reported by Porowski (Porowski, S., J. Crystal Growth 189/190 (1998) pp. 153-158, in which a GaN bulk crystal is synthesized from a Ga melt under an elevated temperature of 1400-1700° C. and an elevated $N_2$ pressure of 12-20 kbar (1.2-2 GPa). This process, however, can only provide an extremely small crystal in the order of 1 cm in diameter at best. Further the process of Porowski requires a specially built pressure-resistant apparatus and a long time is needed for loading or unloading a source material, or increasing or decreasing the pressure and temperature. Thus, the process of this prior art would not be a realistic solution for mass-production of a GaN bulk crystal substrate. It should be noted that the reaction vessel of Porowski has to withstand the foregoing extremely high pressure, which is rarely encountered in industrial process, under the temperature exceeding 1400° C.

Further, there is a known process of growing a GaN bulk crystal without using an extremely high pressure environment for growing a GaN bulk crystal as reported by Yamane, H., et al., Chem. Mater. 1997, 9, 413-416. More specifically, the process of Yamane et al. successfully avoids the use of the extremely high-pressure used in Porowski, by conducting the growth of the GaN bulk crystal from a Ga melt in the presence of a Na flux.

According to the process of Yamane, a metallic Ga source and a $NaN_3$ (sodium azide) flux are confined in a pressure-resistance reaction vessel of stainless steel together with a $N_2$ atmosphere, and the reaction vessel is heated to a temperature of 600-800° C. and held for a duration of 24-100 hours. As a result of the heating, the pressure inside the reaction vessel is elevated to the order of 100 kg/cm$^2$ (about 10 MPa), which is substantially lower than the pressure used by Porowski. As a result of the reaction, GaN crystals are precipitated from the melt of a Na—Ga system. In view of the relatively low pressure and low temperature needed for the reaction, the process of Yamane et al. is much easier to implement.

On the other hand, the process of Yamane relies upon the initially confined $N_2$ molecules in the atmosphere and the N atoms contained in the $NaN_3$ flux for the source of N. Thus, when the reaction proceeds, the $N_2$ molecules in the atmosphere or the N atoms in the Na—Ga melt are depleted with the precipitation of the GaN crystal, and there appears a limitation in growing a large bulk crystal of GaN. The GaN crystals obtained by the process of Yamane et al. typically have a size of 1 mm or less in diameter. Thus, the process of Yamane et al. op cit., while being successful in forming a GaN bulk crystal at a relatively low pressure and temperature, cannot be used for a mass production of a GaN substrate in the industrial base.

BRIEF SUMMARY

In an aspect of this disclosure, a novel and useful GaN semiconductor device having a bulk crystal substrate is provided.

In another aspect of this disclosure, a process of making a bulk crystal substrate of a GaN single crystal is provided.

In another aspect of this disclosure, a process of fabricating a GaN semiconductor device having a bulk crystal substrate of a GaN single crystal is provided.

In another aspect of this disclosure, a bulk crystal substrate of a single crystal GaN is provided.

In another aspect of this disclosure, an optical semiconductor device having a bulk crystal substrate of a GaN single crystal is provided.

In another aspect of this disclosure, an electron device having a bulk crystal substrate of a GaN single crystal is provided.

In another aspect of this disclosure, an apparatus for making a bulk crystal substrate of a GaN single crystal is provided.

In an exemplary embodiment of this disclosure, a high-quality GaN bulk crystal substrate is obtained with a process suitable for mass-production, by continuously supplying N so as to compensate for the depletion of N occurring in the system in which precipitation of a GaN single crystal takes place. By using the GaN bulk crystal substrate thus obtained, it is possible to fabricate an optical semiconductor device that produces an optical radiation of blue to ultraviolet wavelength with a large optical power. Further, the GaN bulk crystal substrate can be used as a substrate of an electron device such as HEMT.

Other aspects and further features of the present invention will become apparent from the following detailed description when read in conjunction with the attached drawings.

BRIEF DESCRIPTION OF THE DRAWINGS

FIGS. 15A and 15B are diagrams showing a part of the growth apparatus of FIG. 14;

FIG. 19 is a diagram showing X-ray diffraction data obtained for a GaN bulk crystal according to an eleventh embodiment of the present invention;

DETAILED DESCRIPTION OF THE INVENTION

First Embodiment

Figure 3:
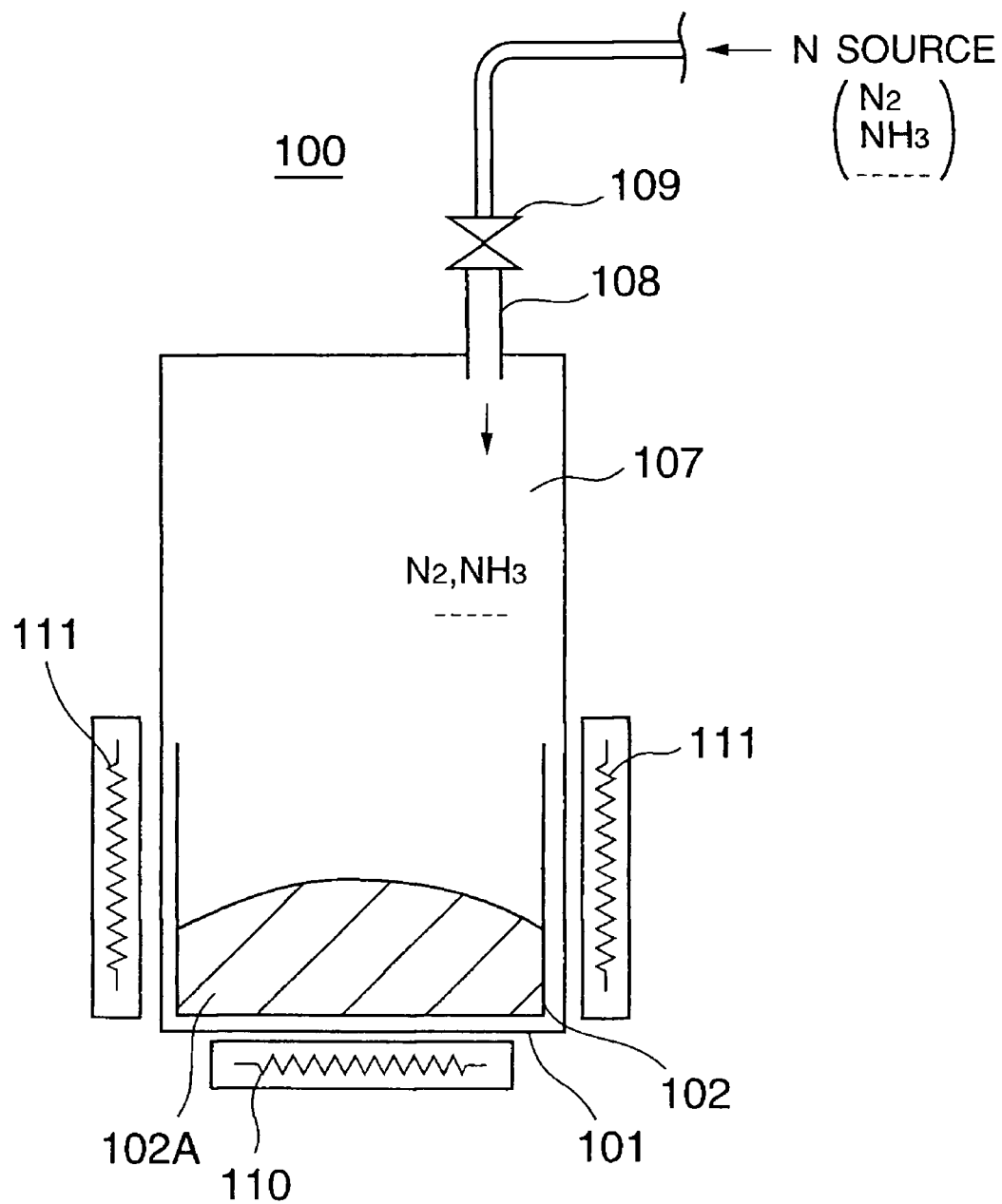
FIG. 3 is a diagram showing the construction of a growth apparatus used in a first embodiment of the present invention for growing a GaN bulk crystal.

FIG. 3 shows the construction of a growth apparatus 100 used in a first embodiment of the present invention for growing a GaN bulk crystal.

Referring to FIG. 3, the growth apparatus 100 includes a pressure-resistant reaction vessel 101 typically of a stainless steel having an inner diameter of about 75 mm and a length of about 300 mm and accommodates therein a crucible 102 of Nb or BN. As will be explained later, the crucible 102 is loaded with a starting material of metallic Ga and a $NaN_3$ flux and is confined in the reaction vessel 101 together with an $N_2$ atmosphere 107. Further, the reaction vessel 101 is supplied with $N_2$ or a gaseous compound of N from an external source via a regulator valve 109 and an inlet 108. The reaction vessel 101 thus loaded with the starting material in the crucible 102 is heated by energizing heaters 110 and 111 to a temperature of 650-850° C., and the pressure inside the reaction vessel is regulated to a moderate value of about 5 MPa by controlling the valve 109. By holding the temperature and the pressure, a precipitation of GaN bulk crystal takes place from a Na—Ga melt, which is formed in the crucible 102 as a result of the melting of the starting material.

Figure 4A:
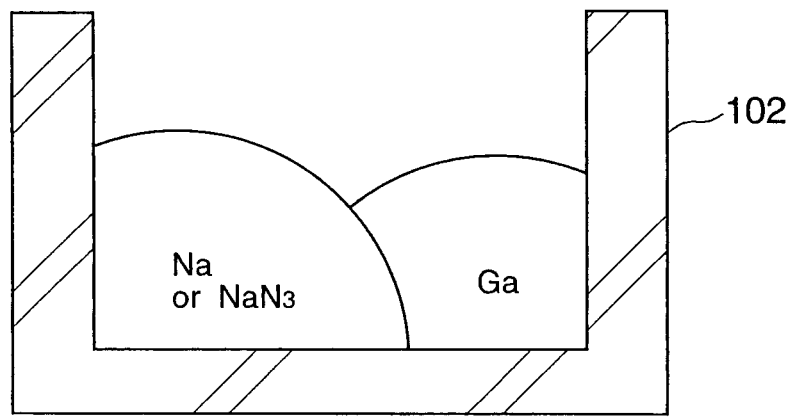
FIGS. 4A and 4B are diagrams showing a part of the apparatus of FIG. 3 in detail.
Figure 4B:
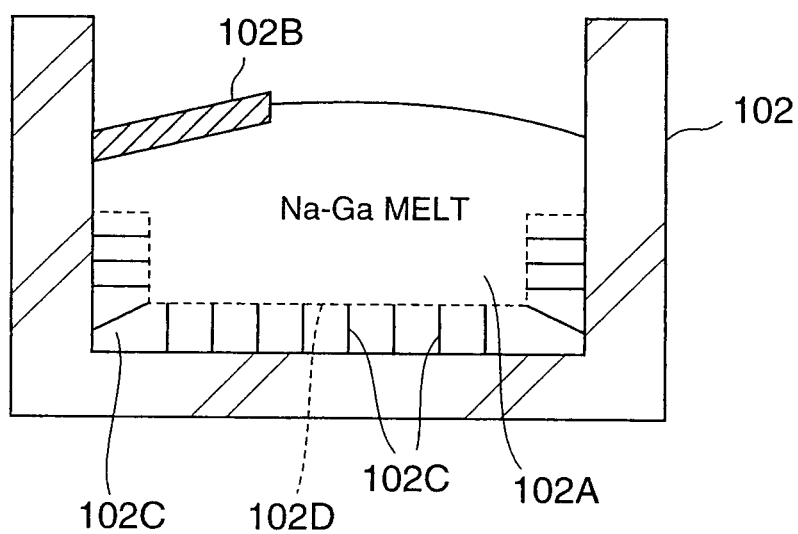

FIG. 4A shows the loading of the starting material in the crucible 102, while FIG. 4B shows the state in which the source material has caused a melting.

Referring to FIG. 4A, a high-purity metallic Ga and a high-purity metallic Na are weighed carefully and loaded into the crucible 102, wherein the foregoing process of weighing and loading are conducted in the $N_2$ atmosphere. It is also possible to use high-purity $NaN_3$ in place of high-purity metallic Na source.

In the state of FIG. 4B, on the other hand, there appears a melt 102A of the Na—Ga system in the crucible 102 and crystallization of GaN takes place from various parts of the melt 102A including a free surface of the melt and a sidewall or bottom wall of the crucible 102. There, it was observed that a large single crystal 102B of GaN grows on the melt free surface contacting with the atmosphere and fine needle-like GaN crystals 102C grow on the sidewall or bottom wall of the crucible 102.

With the growth of the GaN crystals, particularly with the growth of the GaN single crystal 102B, N in the atmosphere is consumed and the pressure inside the reaction vessel gradually falls as a result of depletion of N in the atmosphere. Thus, in the present embodiment, the depletion of N in the atmosphere 107 is compensated for by replenishing $N_2$ or a compound of N such as $NH_3$ from an external source. Thereby, the growth of the GaN single crystal 102B continues at the melt free surface and a large GaN single crystal suitable for use in an optical semiconductor device such as a laser diode or light-emitting diode as a GaN bulk crystal substrate is obtained. The construction of FIG. 3 can easily produce the GaN single crystal 102B with a thickness of 100 μm or more. The GaN single crystal 102B thus formed at the temperature of 650-850° C. has a hexagonal crystal symmetry.

Figure 5:
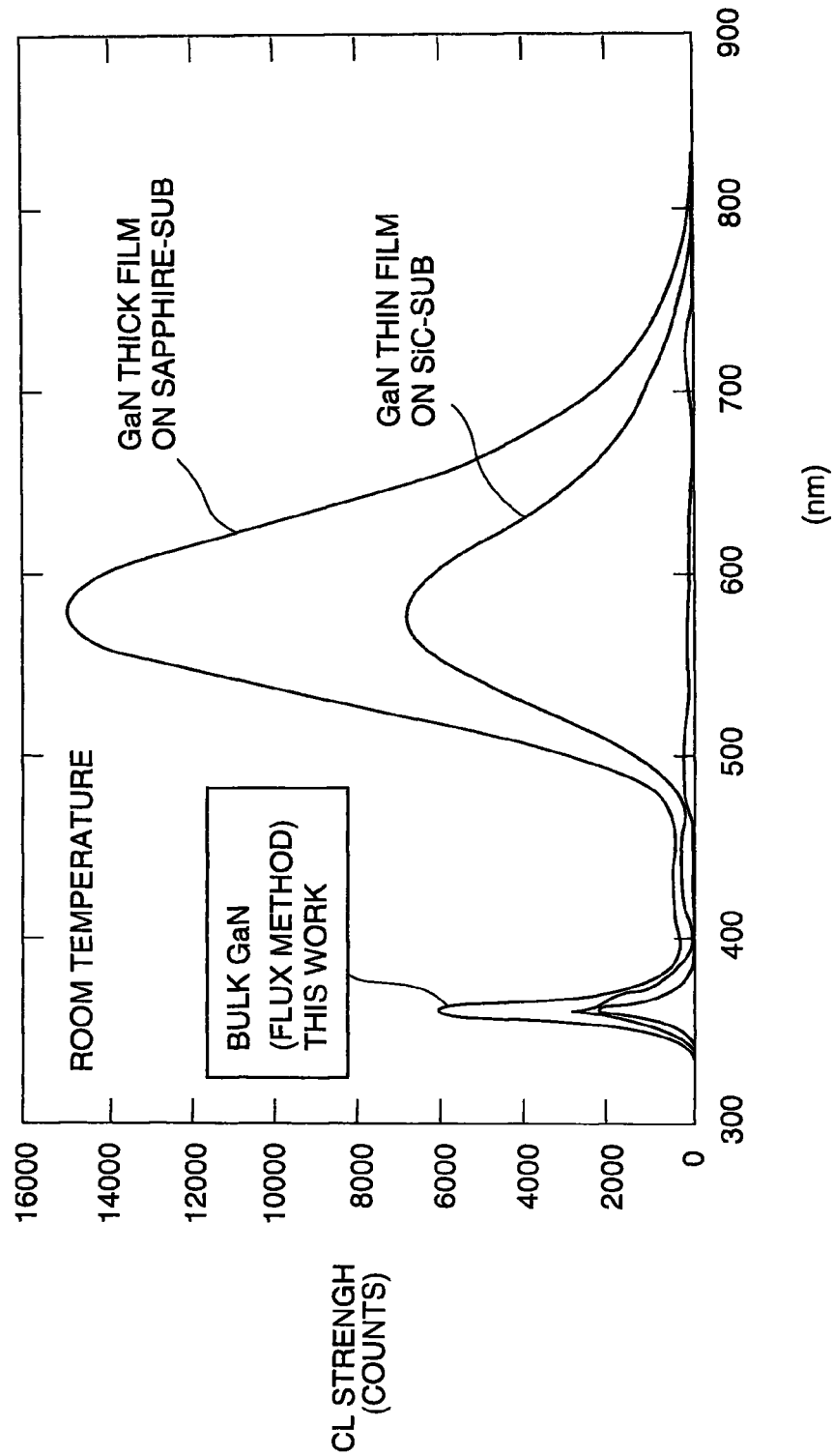
FIG. 5 is a diagram showing a cathode luminescent spectrum of a GaN bulk crystal obtained in the first embodiment.

FIG. 5 shows the cathode luminescent spectrum of the GaN single crystal 102B thus obtained in comparison with the cathode luminescent spectrum of a GaN thick film grown on a sapphire substrate or an SiC substrate.

Referring to FIG. 5, it can be seen that the GaN crystal 102B of the present embodiment shows a distinct and strong peak corresponding to the band edge of GaN at the wavelength of about 360 nm. Further, it can be seen that no other peak exists in the GaN single crystal 102B of the present embodiment. The result of FIG. 5 indicates that the GaN crystal 102B thus formed has a defect density of less than $10^2$-$10^3$ cm$^{-2}$. Thus, the GaN single crystal 102B is suitable for use as a bulk GaN substrate of various optical semiconductor devices including a laser diode and a light-emitting diode as noted already. Hereinafter, the GaN single crystal 102B will be called a GaN bulk crystal in view of application to a GaN bulk crystal substrate.

Contrary to the present embodiment, the GaN thick film formed on the sapphire substrate or formed on the SiC substrate shows a remarkable peak at the wavelength of about 600 nm corresponding to deep impurity levels. This clearly indicates that the GaN thick film thus formed on a sapphire substrate or an SiC substrate contains a substantial amount of defects. Associated with the high level of defects, it can be seen that the peak strength for the band edge is substantially smaller than the case of the GaN bulk crystal 102B of the present embodiment.

In the growth process of FIG. 4B, it should be noted that there appears also an intermetallic compound 102D of GaNa along the sidewall and bottom surface of the crucible 102 indicated in FIG. 4B by a broken line. Thus, the region represented in FIG. 4B by the broken line in fact includes the fine GaN crystals 102C and the GaNa intermetallic compound 102D in the form of a mixture. The GaN fine crystals 102C or the GaNa intermetallic compound 102D thus formed releases Ga into the melt 102A, and the Ga atoms thus released contribute to the growth of the GaN bulk crystal 102B when transported to the melt surface.

Thus, by continuously replenishing $N_2$ or $NH_3$, the growth process of the GaN bulk crystal 102B continues until Ga in the melt 102A is used up.

Figure 6:
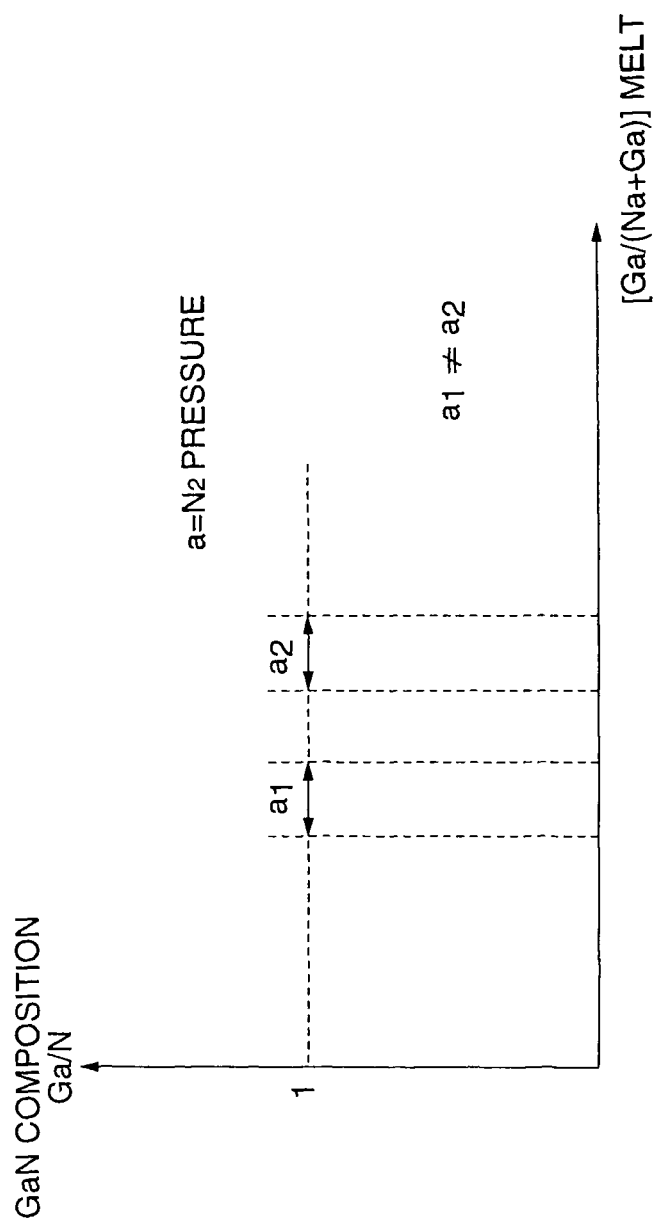
FIG. 6 is a diagram showing a control of GaN composition in the growth apparatus of FIG. 3.

FIG. 6 shows the control of the $N_2$ pressure in the atmosphere 107 with the growth of the GaN bulk crystal 102B from the melt 102A.

Referring to FIG. 6, it can be seen that the $N_2$ pressure a necessary for maintaining the stoichiometric composition for the GaN bulk crystal 102B changes depending on the Ga content in the melt 102A represented in the horizontal axis. When the $N_2$ pressure in the atmosphere 107 is fixed ($a_1$=$a_2$), it is not possible to maintain the stoichiometric composition for the GaN bulk crystal 102B. Thus, the present invention changes the $N_2$ pressure a in the atmosphere 107 with the progress of growth of the GaN bulk crystal 102B as represented as $a_1 \neq a_2$.

Second Embodiment

Figure 7:
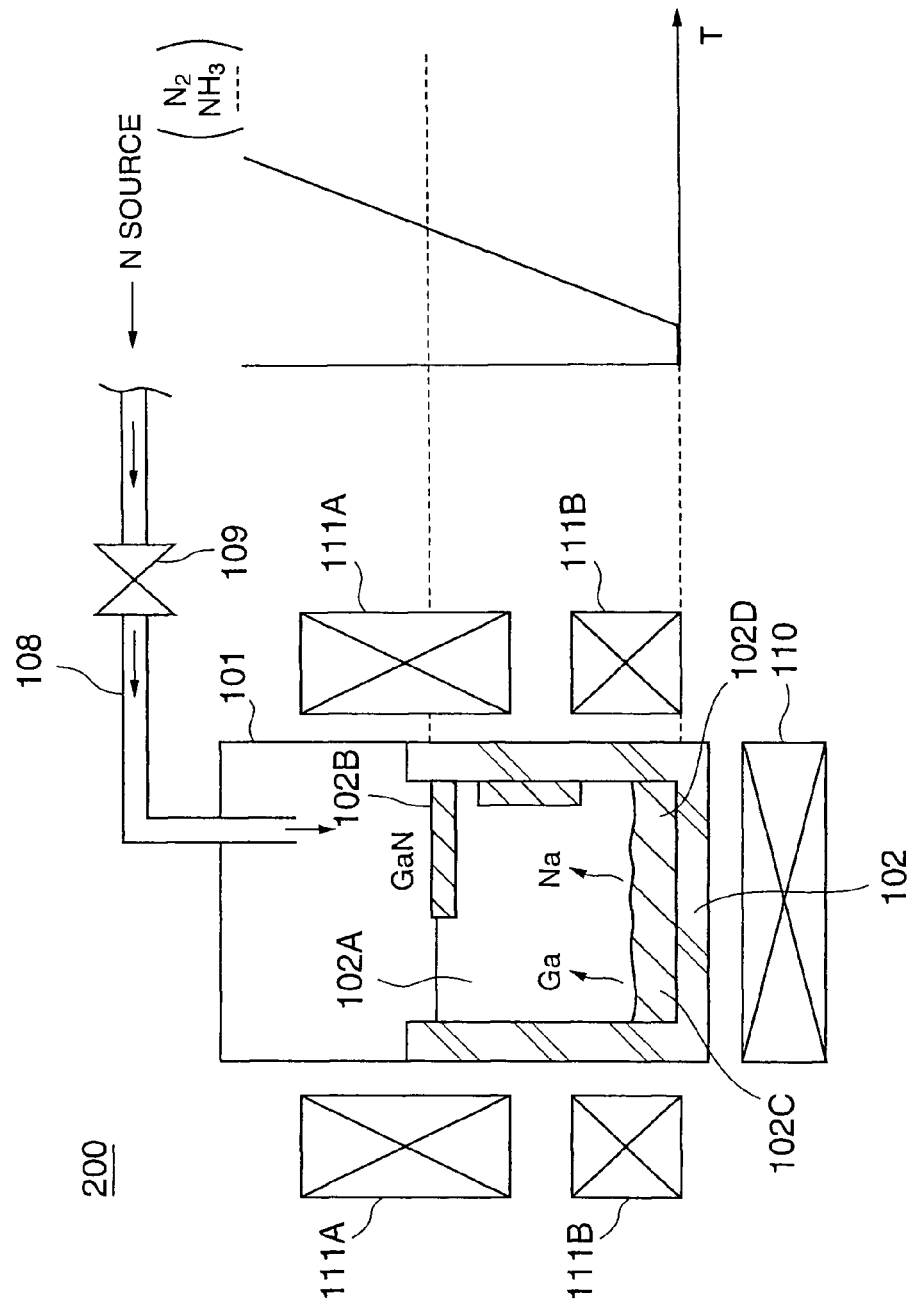
FIG. 7 is a diagram showing the construction of a growth apparatus used in a second embodiment of the present invention for growing a GaN bulk crystal.

FIG. 7 shows the construction of a growth apparatus 200 according to a second embodiment of the present invention, wherein those parts corresponding to the parts described previously are designated by the same reference numerals and the description there of will be omitted.

Referring to FIG. 7, the present embodiment uses heaters 111A and 111B in place of the heater 111 and induces a temperature gradient in the melt 102A for facilitating transport of Ga from the GaN fine crystals 102C or the GaNa intermetallic compound 102D to the melt surface.

More specifically, the heater 111B is provided in correspondence to the bottom part of the crucible 102 and controls, together with the heater 111A, the melt temperature at the bottom part of the crucible 102 lower than the melt surface. As a result of energization of the heaters 111A and 111B, a temperature gradient shown in FIG. 7 is induced.

Due to the increased temperature at the bottom part of the crucible 102, undesirable precipitation of GaN crystals on bottom surface of the crucible 102 is minimized, and the growth of the GaN bulk crystal 102B on the melt surface is promoted substantially. When a GaN fine crystal 102C is formed, such a GaN fine crystal 102C is immediately dissolved into the melt 102A and no substantial deposition occurs on the bottom part of the crucible 102. Further, the intermetallic compound of GaNa, formed at a temperature lower than about 530° C., acts also as the source of Ga and Na in the melt 102A.

Similarly to the first embodiment, the GaN bulk crystal 102B formed according to the present embodiment has a defect density in the order of $10^2$-$10^3$ cm$^{-2}$ or less. Thus, the GaN bulk crystal 102B is suitable for a bulk GaN substrate of various optical semiconductor devices including a laser diode and a light-emitting diode.

Third Embodiment

Figure 8:
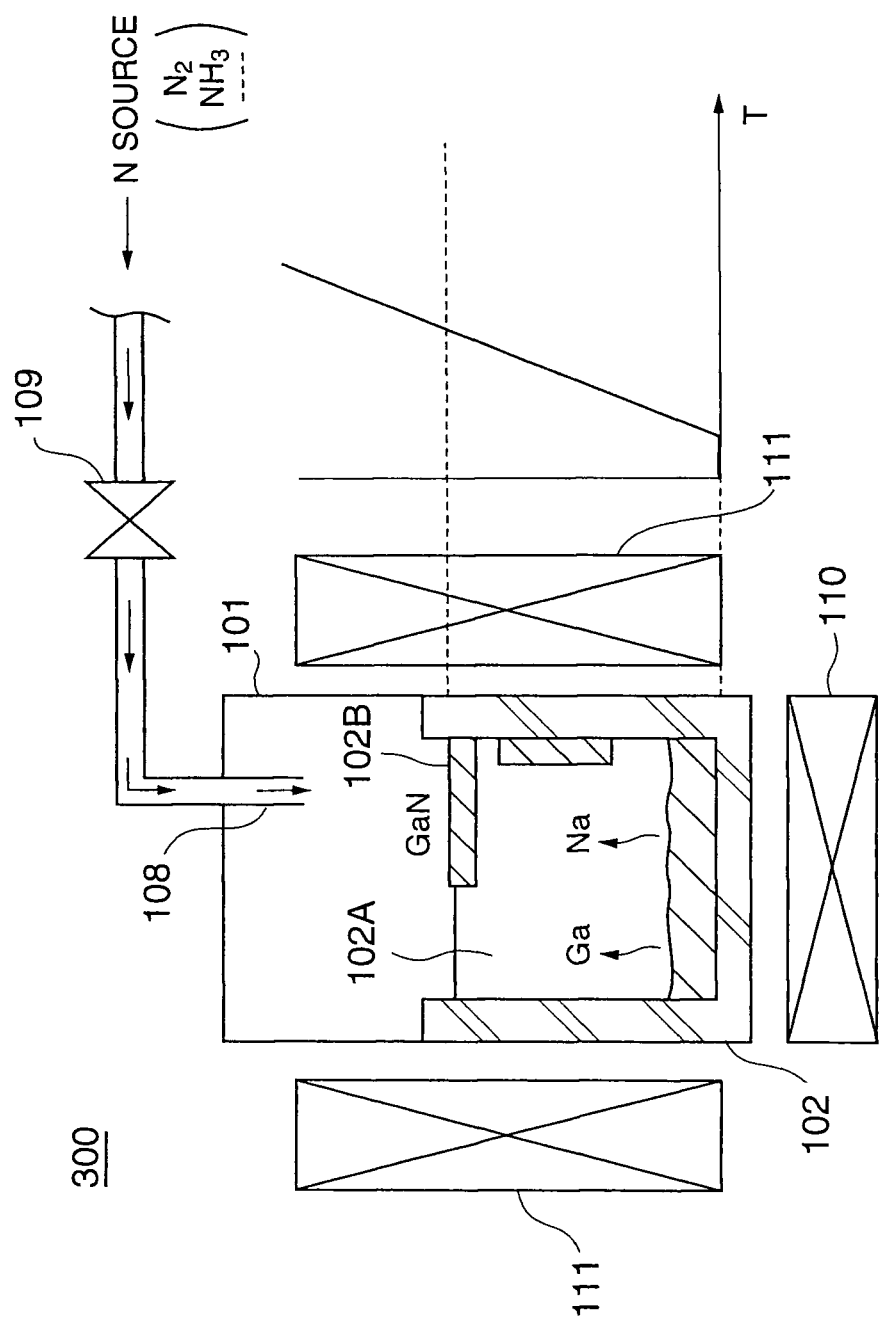
FIG. 8 is a diagram showing the construction of a growth apparatus used in a third embodiment of the present invention for growing a GaN bulk crystal.

FIG. 8 shows the construction of a growth apparatus 300 according to a third embodiment of the present invention, wherein those parts corresponding to the parts described previously are designated by the same reference numerals and the description thereof will be omitted.

Referring to FIG. 8, the present embodiment is a modification of the embodiment of FIG. 7 and uses the heaters 110 and 111, described with reference to the growth apparatus 100 for inducing the desired temperature gradient. As other aspects of the present embodiment are substantially the same as those of the previous embodiment, further description will be omitted.

Fourth Embodiment

Figure 9:
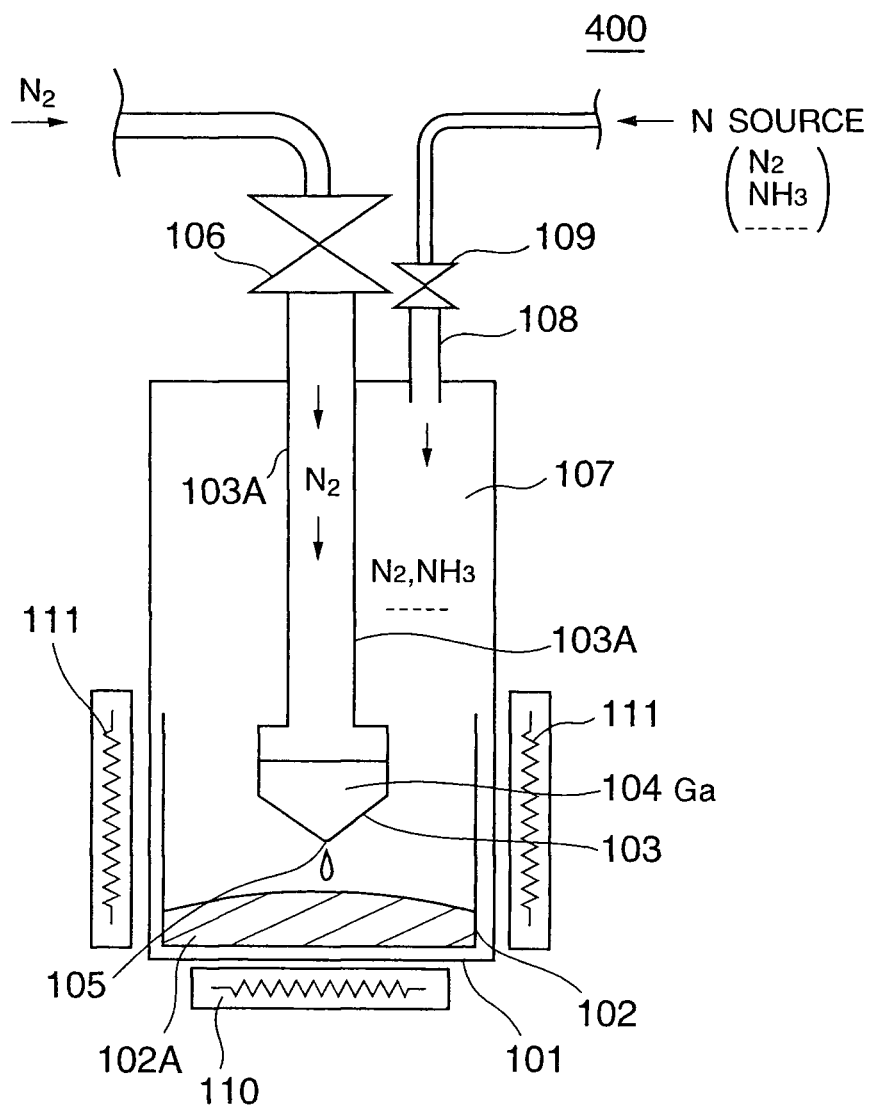
FIG. 9 is a diagram showing the construction of a growth apparatus used in a fourth embodiment of the present invention for growing a GaN bulk crystal.

FIG. 9 shows the construction of a growth apparatus 400 according to a fourth embodiment of the present invention, wherein those parts corresponding to the parts described previously are designated by the same reference numerals and the description thereof will be omitted.

Referring to FIG. 9, the growth apparatus 400 has a construction similar to that of FIG. 3, except that there is provided a container 103 holding a metallic Ga source 104 inside the reaction vessel 101. The container 103 is provided at a first end of a tube 103A extending outside of the reaction vessel 101, and there is provided a pressure regulator 106 at a second, opposite end of the tube 103. The pressure regulator 106 is supplied with a pressurized $N_2$ gas from an external source and causes a molten Ga, formed in the container 103 as a result of heating, to drip to the Na—Ga melt 102A in the crucible 102 via a hole 105 formed at a bottom part of the container 103.

According to the construction of FIG. 9, depletion of Ga in the melt 102A is replenished from the Ga source 104 and a thickness of 300 μm or more is obtained for the GaN bulk crystal 102B as a result of the continuous crystal growth.

Similarly to the previous embodiments, the GaN bulk crystal 102B formed according to the present embodiment has a defect density of $10^2$-$10^3$ cm$^{-2}$ or less. Thus, the GaN bulk crystal 102B of the present embodiment is suitable for use as a bulk GaN substrate of various optical semiconductor devices including a laser diode and a light-emitting diode.

Fifth Embodiment

Figure 10:
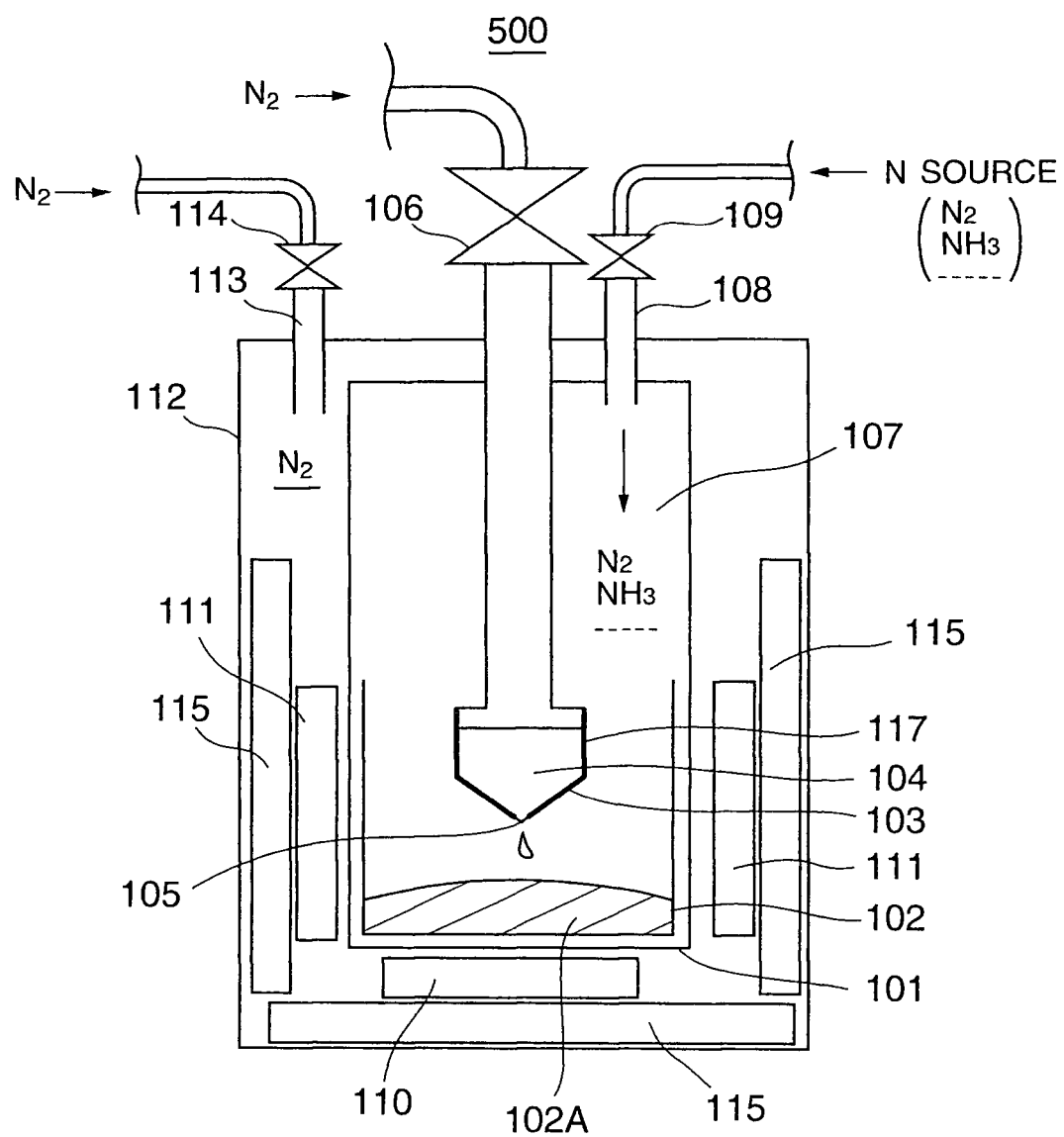
FIG. 10 is a diagram showing the construction of a growth apparatus used in a fifth embodiment of the present invention for growing a GaN bulk crystal.

FIG. 10 shows the construction of a growth apparatus 500 according to a fifth embodiment of the present invention, wherein those parts corresponding to the parts described previously are designated by the same reference numerals and the description thereof will be omitted.

Referring to FIG. 10, the growth apparatus 500 has a construction similar to that of the growth apparatus of FIG. 9, except that there is provided an outer pressure vessel 112 outside the reaction vessel 101, and the space between the reaction vessel 101 and the outer pressure vessel 112 is filled with a pressurized gas such as $N_2$, which is introduced via a regulator 114 and an inlet 113.

By providing the pressure vessel 112 outside the reaction vessel 101, the pressurized reaction vessel 101 is supported from outside and the design of the reaction vessel 101 becomes substantially easier. As represented in FIG. 10, there is provided a thermal insulator 115 between the heater 110 or 111 and the outer pressure vessel 112 and the temperature rise of the pressure vessel 112 is avoided. Thereby, the pressure vessel 112 maintains a large mechanical strength even when the inner, reaction vessel 101 is heated to the temperature exceeding 600 or 700° C. In order to avoid the decrease of mechanical strength, it is possible to provide a water cooling system (not shown) on the outer pressure vessel 112.

The outer pressure vessel 112 can be provided also to the growing apparatuses 100-300 explained before as well as to the growing apparatuses to be described hereinafter.

As other features of the present embodiment are substantially the same as those of the previous embodiments, further description thereof will be omitted.

Sixth Embodiment

Figure 11:
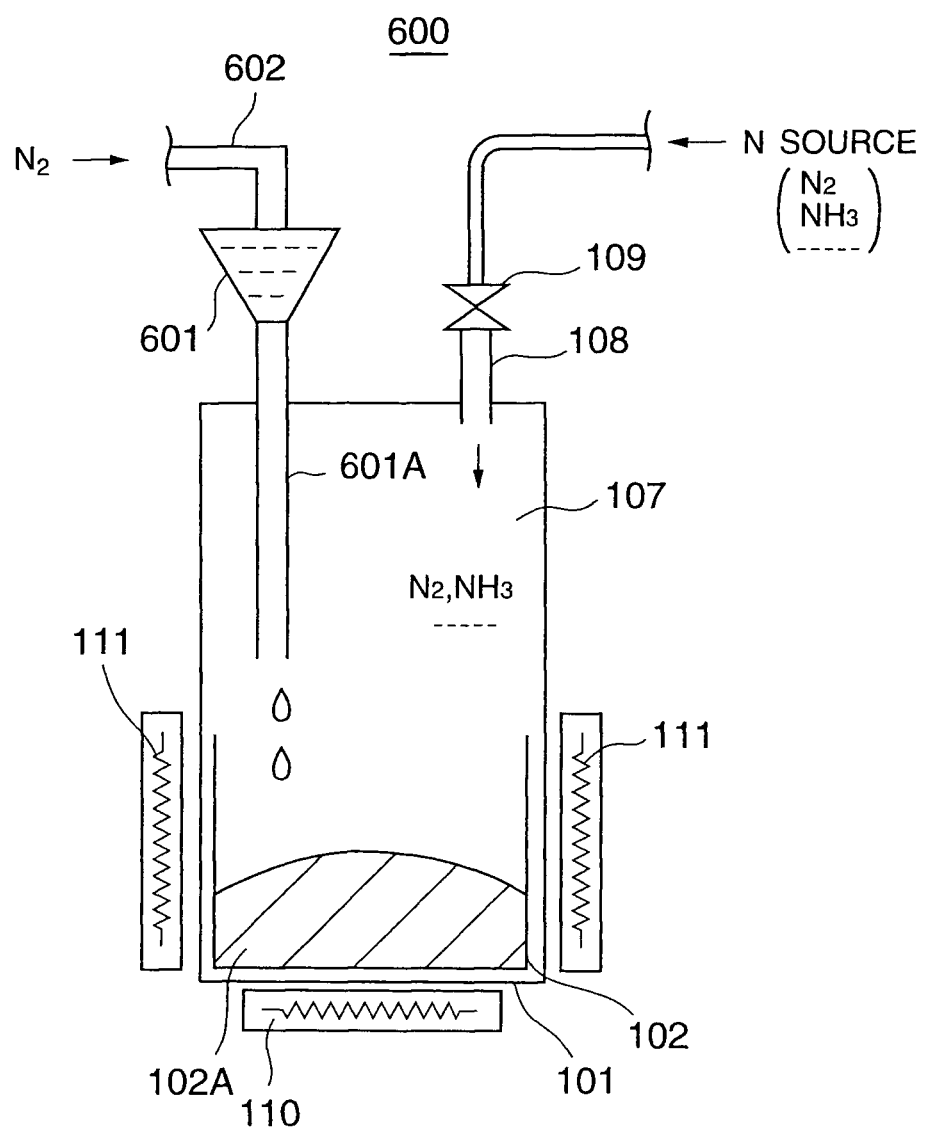
FIG. 11 is a diagram showing the construction of a growth apparatus used in a sixth embodiment of the present invention for growing a GaN bulk crystal.

FIG. 11 shows the construction of a growing apparatus 600 according to a sixth embodiment of the present invention, wherein those parts corresponding to the parts described previously are designated by the same reference numerals and the description thereof will be omitted.

Referring to FIG. 11, the growing apparatus 600 has a construction similar to that of the growing apparatus 100 of FIG. 3, except that there is provided a holder 601 holding a Ga—Na melt outside the reaction vessel 101 and the Ga—Na melt in the holder 601 is supplied into the reaction vessel 101 and to the melt 102A in the crucible 102 via a tube 601A penetrating through a wall of the reaction vessel 101, in response to a pressurization of the holder 601 by a pressurized gas such as an $N_2$ gas supplied via a line 602.

According to the present embodiment, the depletion of Ga in the melt 102A is replenished together with the Na flux, and the growth of the GaN bulk crystal 102B at the free surface of the melt 102A is conducted continuously. It should be noted that depletion of N in the system is also replenished by the external N source similarly to the previous embodiments. As a result, a high-quality GaN bulk crystal suitable for use as a substrate of various optical semiconductor devices is obtained with a thickness well exceeding 100 μm, generally about 300 μm or more.

Seventh Embodiment

Figure 12:
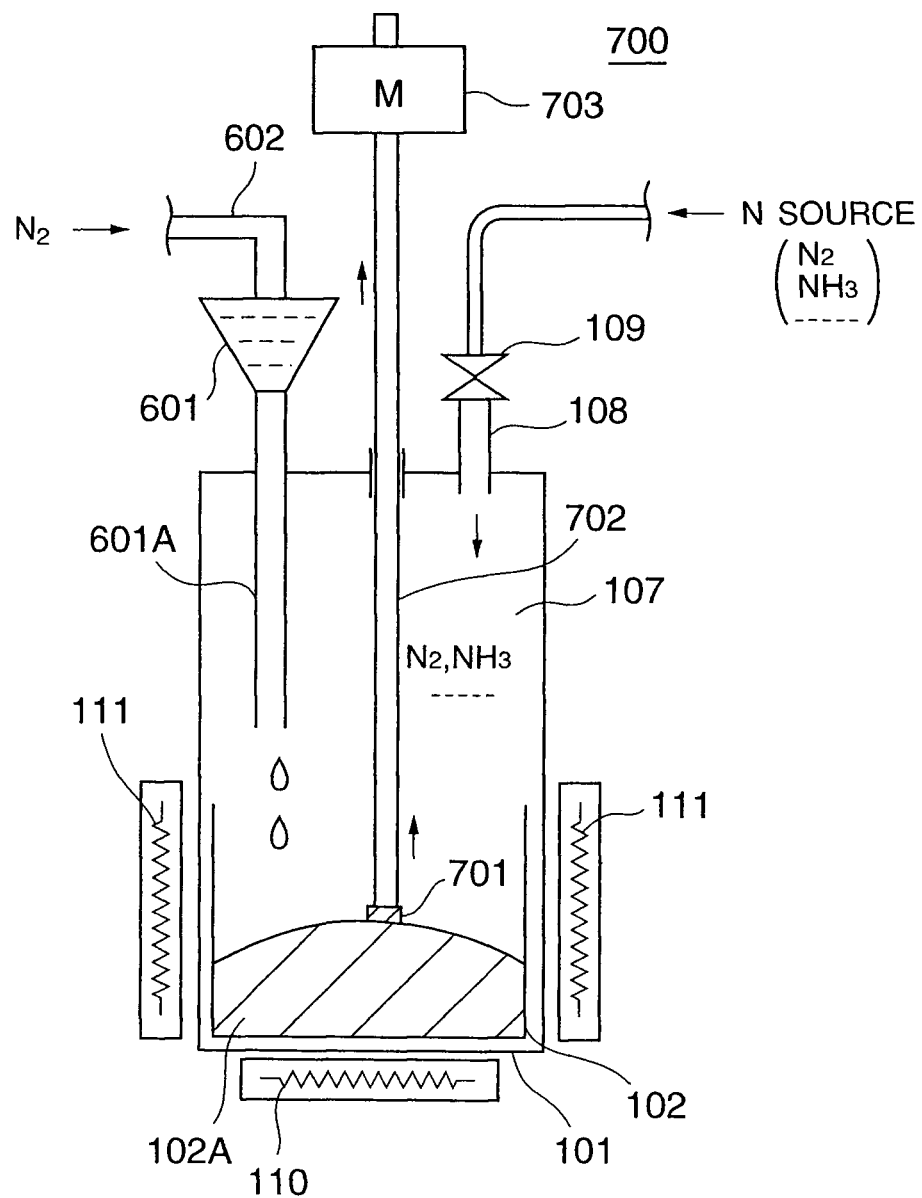
FIG. 12 is a diagram showing the construction of a growth apparatus used in a seventh embodiment of the present invention for growing a GaN bulk crystal.

FIG. 12 shows the construction of a growth apparatus 700 according to a seventh embodiment of the present invention, wherein those parts corresponding to the parts described previously are designated by the same reference numerals and the description thereof will be omitted.

Referring to FIG. 12, the growing apparatus 700 has a construction similar to that of the growing apparatus 600 of the previous embodiment, except that there is provided a rod 702 carrying a seed crystal 701 at a tip end thereof in contact with the free surface of the melt 102A in the crucible 102. Further there is provided a motor 703 for pulling up the rod 702, and there occurs a continuous growth of the GaN bulk crystal 102B at the melt surface with the pulling up of the rod 702. Thereby, an ingot of a GaN bulk crystal is obtained.

By slicing the GaN bulk crystal ingot thus obtained, it is possible to mass produce the GaN bulk crystal substrate for use in various optical semiconductor devices including a laser diode and a light-emitting diode.

Figure 13:
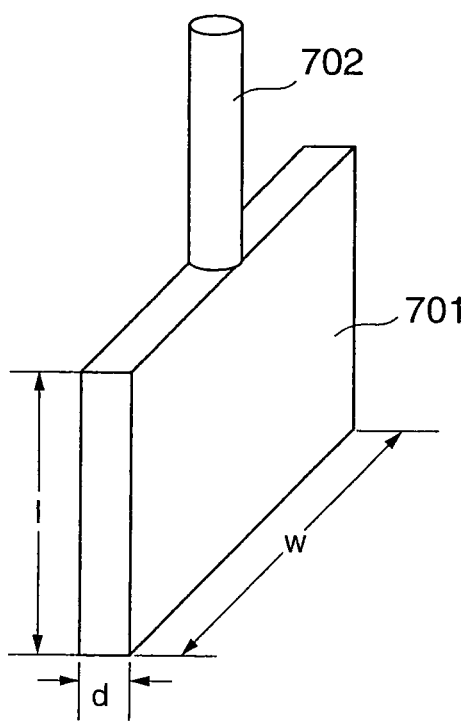
FIG. 13 is a diagram showing the construction of a seed crystal used in the growth apparatus of FIG. 12.

FIG. 13 shows an example of the seed crystal 701 provided at the tip end of the rod 702.

Referring to FIG. 13, the seed crystal 702 is formed to have a slab shape with a width w and a thickness d corresponding to the width and thickness of the GaN substrate to be formed. Thus, by pulling up the rod 702 straight in the upward direction, a slab-shaped GaN bulk crystal is grown continuously. Thus, by merely polishing the surface of the GaN bulk crystal slab, followed by a cleaving process, it is possible to mass-produce the GaN bulk crystal substrate having a quality suitable for use in various optical semiconductor devices including a laser diode and a light-emitting diode.

As other features of the present embodiment are more or less the same as those of the previous embodiments, further description thereof will be omitted.

Eighth Embodiment

Figure 14:
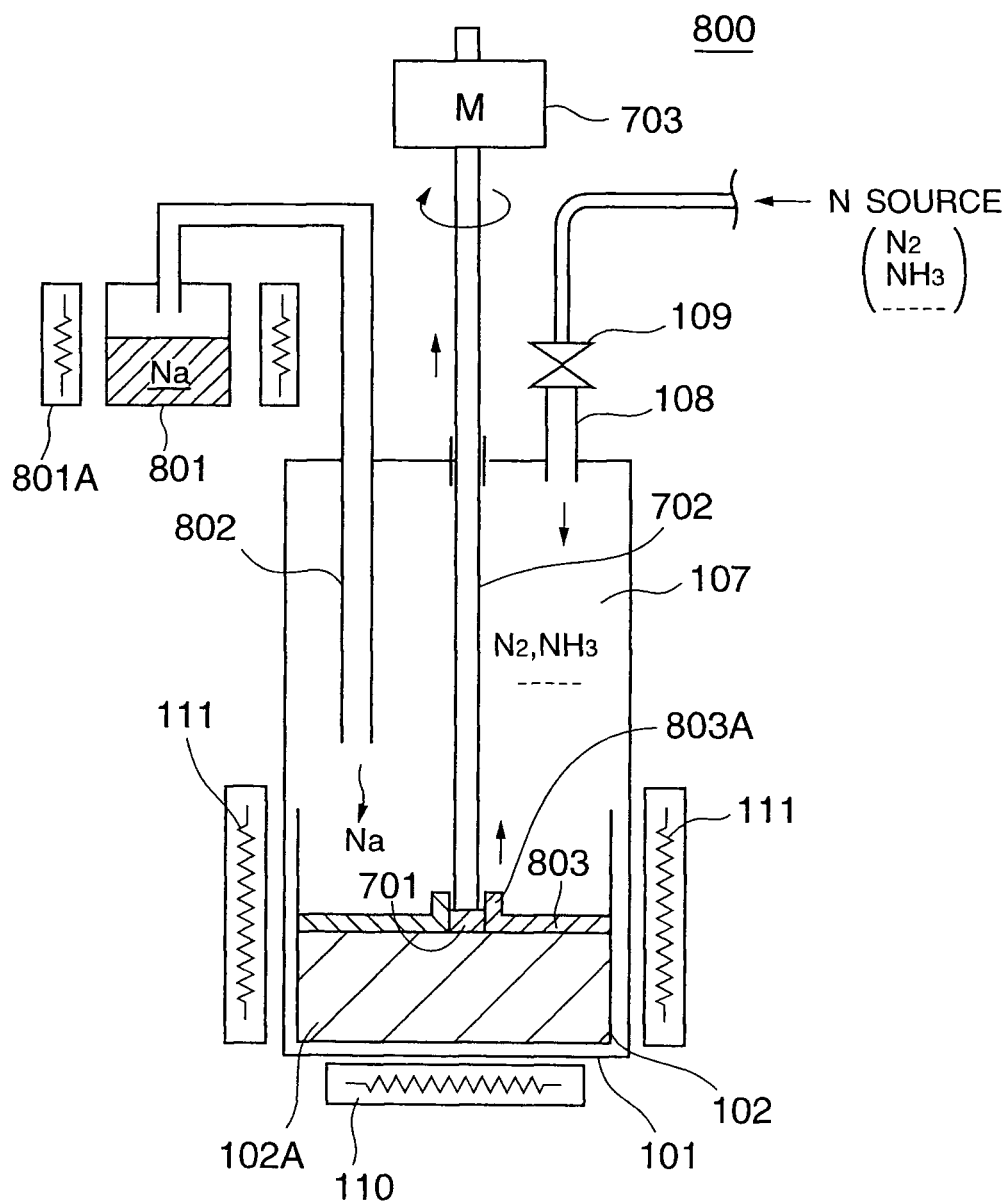
FIG. 14 is a diagram showing the construction of a growth apparatus used in an eighth embodiment of the present invention for growing a GaN bulk crystal.

FIG. 14 shows the construction of a growing apparatus 800 according to an eighth embodiment of the present invention, wherein those parts corresponding to the parts described previously are designated by the same reference numerals and the description thereof will be omitted.

Referring to FIG. 14, the growing apparatus 800 has a construction similar to that of the growing apparatus 700 of the previous embodiment, except that a cover member 803 is provided so as to cover the free surface of the melt 102A. Further, the container 601 of a Na—Ga melt is eliminated and a container 801 having a heating mechanism 801A and containing therein a molten Na is provided outside the reaction vessel 101. Thereby, a vapor of Na is supplied from the container 801 into the interior of the reaction vessel 101 via a tube 802 and the Na vapor is added to the atmosphere 107 therein.

According to the present embodiment, uncontrolled precipitation of the GaN fine crystals 102C on the sidewall or bottom surface of the crucible (see FIG. 4B) is minimized, by controlling the vapor pressure of Na from the container 801. Further, no GaN precipitation occurs on the melt free surface, as the free surface of the melt 102A is covered by the cover member 803, except for a central part of the melt where there is formed an opening 803A in the cover member 803 for allowing the seed crystal 701 on the rod 702 to make a contact with the surface of the melt 102A.

Thus, according to the construction of FIG. 14, the Na vapor flux acts selectively at the part of the melt 102A where the growth of the bulk GaN ingot is made, and the uncontrolled precipitation of the GaN fine crystals 102C is effectively suppressed.

Figure 16:
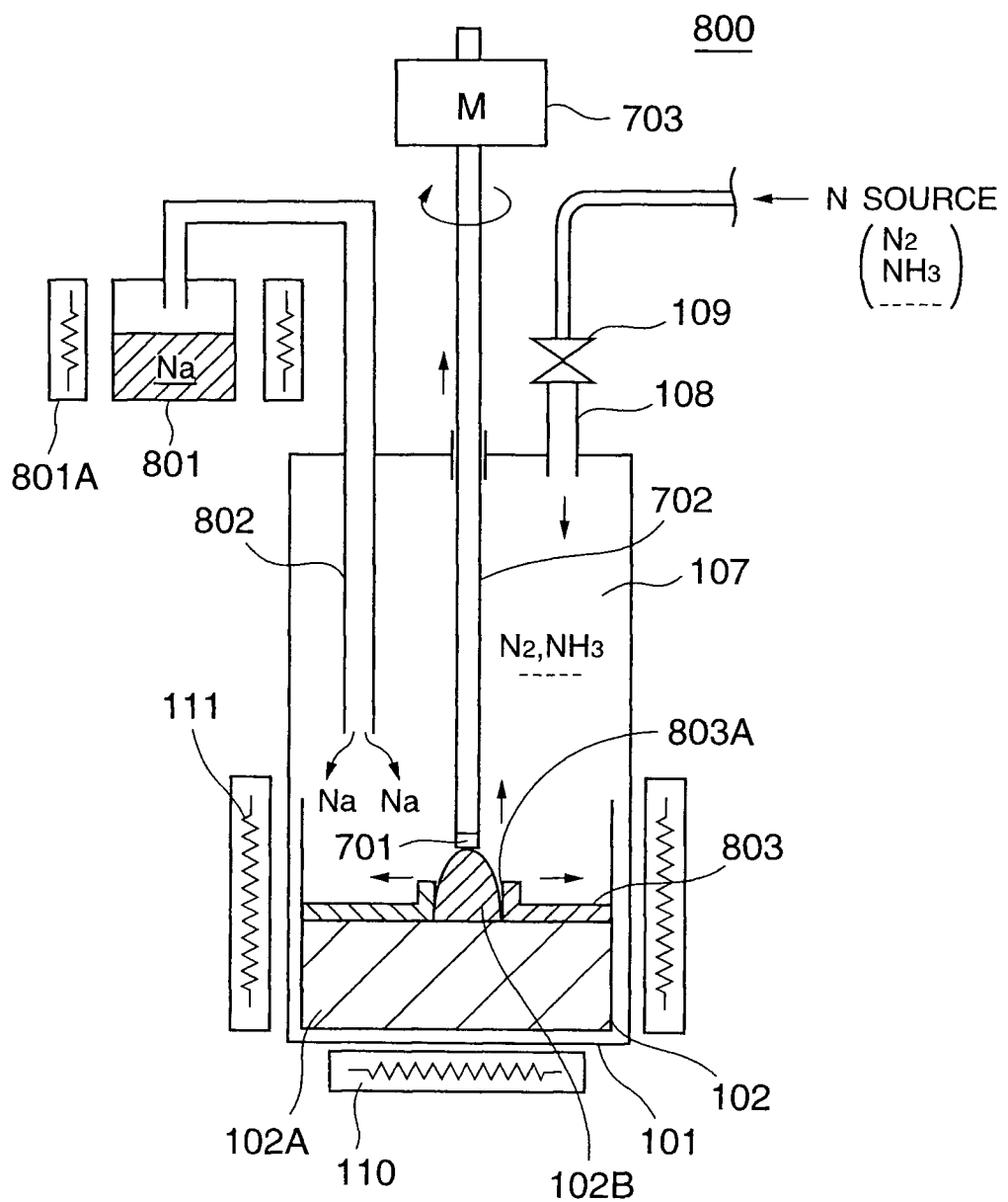
FIG. 16 is a diagram showing the growth apparatus of FIG. 14 in the state in which a growth of the GaN bulk crystal has been made.

It should be noted that cover member 803 has a variable geometry construction formed of a number of small, fan-shaped members, in which the opening 803A can be changed with the growth of the GaN bulk crystal 102B in the form of ingot by moving the fan-shaped members in a direction of an arrow Q as represented in FIGS. 15A and 15B, wherein FIG. 15A shows the state in which the central opening 803A of the cover member 803 is closed while FIG. 15B shows the state in which the opening 803A has been expanded for allowing the growth of the GaN bulk crystal ingot 102B as represented in FIG. 16. It should be noted that FIG. 16 shows the growing apparatus 800 in the state that there occurred a growth of the GaN bulk crystal 102B in the form of ingot.

Ninth Embodiment

Figure 17:
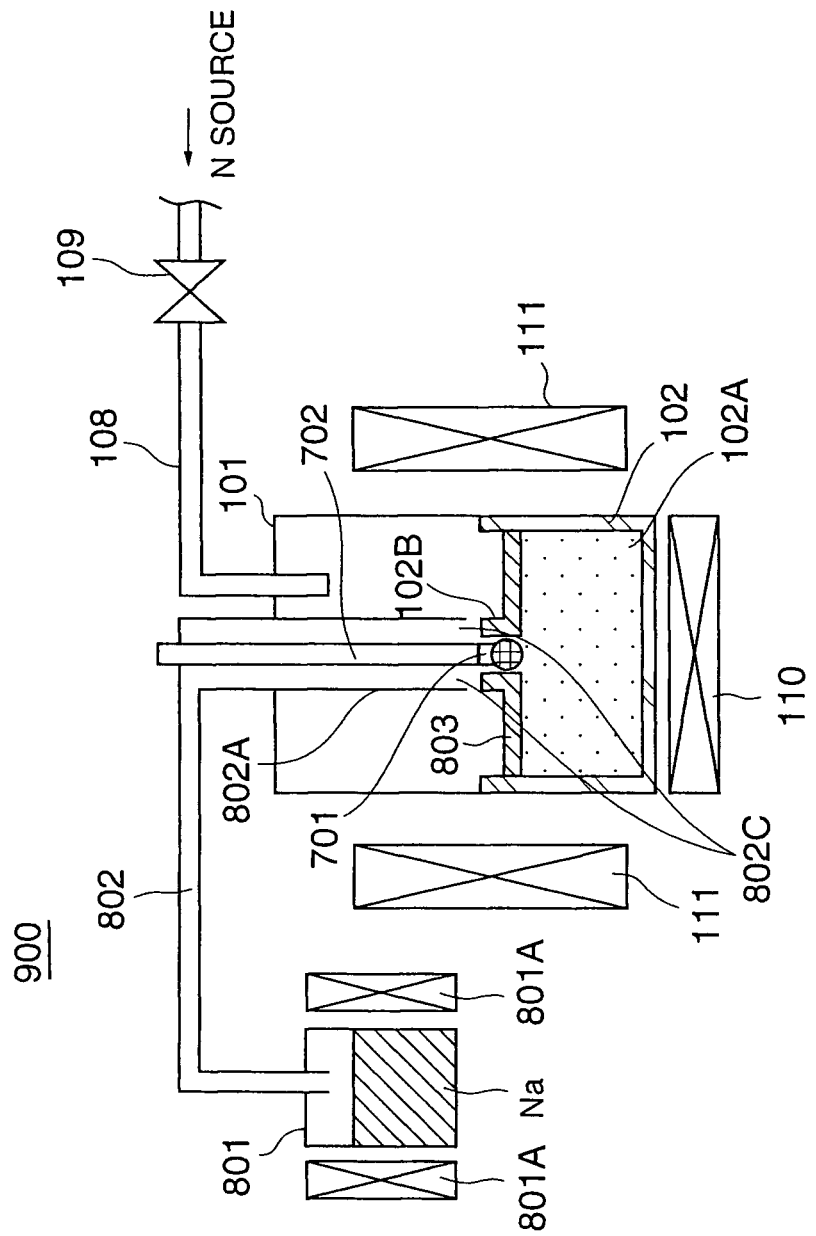
FIG. 17 is a diagram showing the construction of a growth apparatus used in a ninth embodiment of the present invention for growing a GaN bulk crystal.

FIG. 17 shows the construction of a growing apparatus 900 according to a tenth embodiment of the present invention, wherein those parts corresponding to the parts described previously are designated by the same reference numeral and the description thereof will be omitted.

Referring to FIG. 17, the growing apparatus 900 has a construction similar to that of the growing apparatus 800 of the previous embodiment, except that the tube 802 supplying the Na vapor flux has a sleeve part 802A surrounding the rod 702. The sleeve part 802A extends along the rod 702 and has an opening 802C in correspondence to the surface of the melt 102A where the opening 803A is formed in the cover member 803 for the growth of the GaN bulk crystal 102B.

According to the construction of FIG. 17, the Na flux is supplied selectively to the part where the growth of the GaN bulk crystal 102B takes place and an efficient growth becomes possible.

As other aspects of the present embodiment are the same as those of the previous embodiment, further description thereof will be omitted.

Tenth Embodiment

Figure 18:
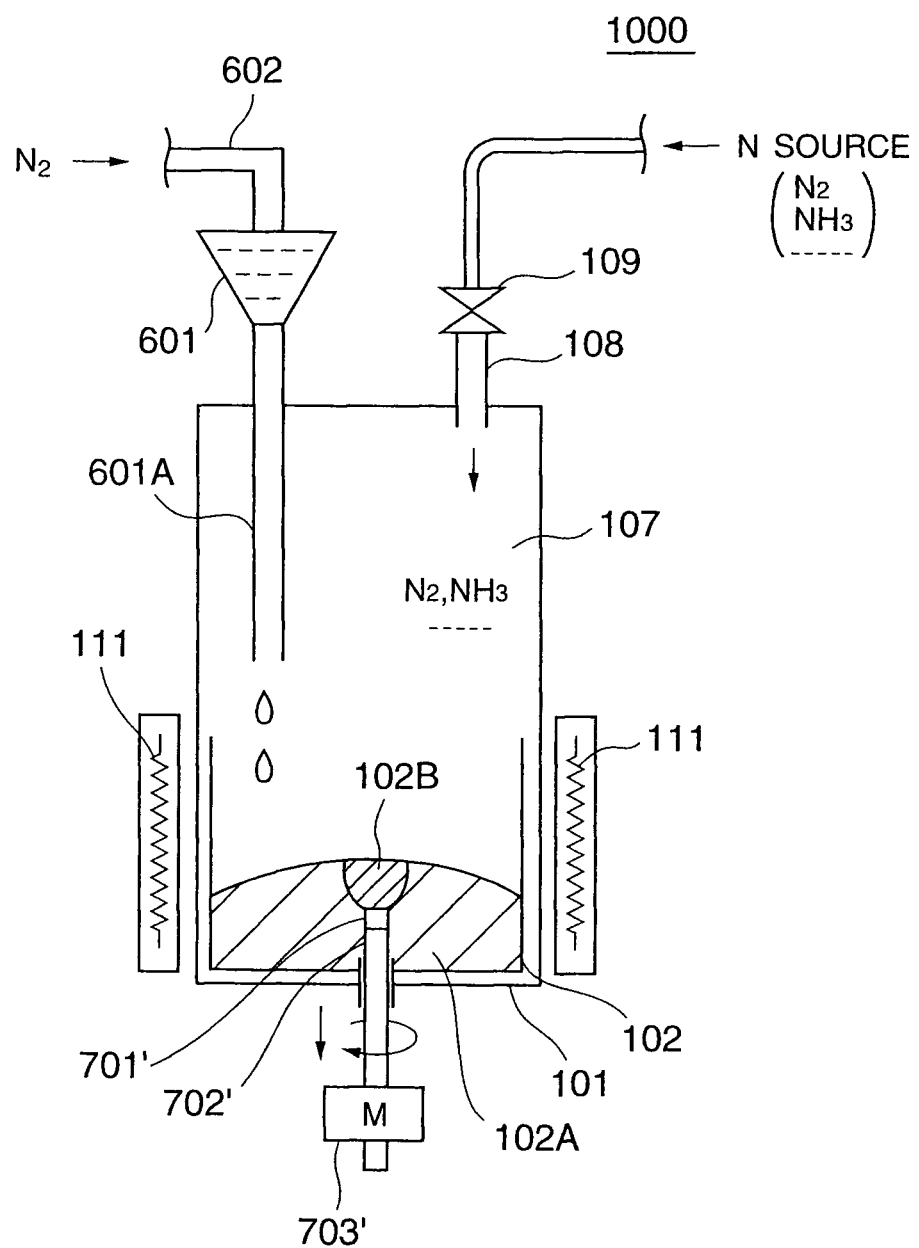
FIG. 18 is a diagram showing the construction of a growth apparatus used in a tenth embodiment of the present invention for growing a GaN bulk crystal.

FIG. 18 shows the construction of a growing apparatus 1000 according to a ninth embodiment of the present invention wherein those parts corresponding to the parts described previously are designated by the same reference numerals and the description thereof will be omitted.

Referring to FIG. 18, the growing apparatus 1000 has a construction similar to that of the growing apparatus 700 of FIG. 12, except that the rod 702 driven by the motor 703 and pulling up the seed 701 in the upward direction is replaced by a rod 702' driven by a motor 703' and pulls down a seed 701' in the downward direction. Thus, as represented in FIG. 18, the GaN bulk crystal 102B forms an ingot grown inside the melt 102A. As other aspects of the present invention is the same as those described before, further description of the present embodiment will be omitted.

Eleventh Embodiment

In any of the foregoing first through tenth embodiments, the grown of the GaN bulk crystal 102B has been achieved at the temperature of 650-850° C. under the presence of a Na flux. As mentioned before, the GaN bulk crystal 102B thus obtained has a symmetry of hexagonal crystal system.

On the other hand, the inventor of the present invention has discovered that a cubic GaN crystal is obtained as the bulk GaN crystal 102B provided that the growth is made at a temperature of less than 600° C. under the presence of Na, or when the growth is made at a temperature of 650-850° C. under the presence of K. K may be introduced into the system in the form of a high-purity metallic K starting material, similarly to the case represented in FIG. 4A.

FIG. 19 shows X-ray diffraction data obtained for a GaN bulk crystal grown by the apparatus of FIG. 3 as the bulk crystal 102B at a temperature of 750° C. under the total pressure of 7 MPa in the reaction vessel 101. In FIG. 19, it should be noted that the Fo represents the structural factor obtained from the diffraction pattern for each of the reflections (h k l), while Fc represents the structural factor calculated from a cubic zinc blende structure. From the diffraction pattern, it was confirmed that the cubic GaN bulk crystal 102B thus formed has a lattice constant $a_0$ of 4.5062±0.0009 Å. Thus, in the calculation of the foregoing structural factor Fc, the lattice constant $a_0$ of 4.5062±0.0009 Å is assumed as the basis of the calculation. Further, FIG. 19 shows an error factor s defined as $$s=\Sigma|Fo-Fc|/\Sigma Fb.$$

Referring to FIG. 19, it can be seen that there is an excellent agreement between the observed structural factor and the calculated structural factor assuming the cubic zinc blende structure for the obtained GaN bulk crystal 102B. It can be safely concluded that the GaN bulk crystal 102B obtained in the present embodiment is a 100% cubic GaN crystal. From the X-ray diffraction analysis, existence of hexagonal GaN crystal was not detected. Further it was confirmed that the cubic GaN bulk crystal 102B thus formed provides a cathode luminescent peak substantially identical with the spectrum of FIG. 5. In other words, the cubic GaN bulk crystal of the present embodiment contains little deep impurity levels or defects and has an excellent quality characterized by a defect density of $10^2$-$10^3$ cm$^{-2}$ or less.

In view of increasing defect density in the GaN crystals grown at low temperatures, and further in view of the fact that a mixture of cubic GaN and hexagonal GaN appears when the growth of the GaN bulk crystal is conducted at the temperature of 600° C. or lower under presence of Na flux, it is preferred to grow a cubic GaN bulk crystal at the temperature of 650-850° C. under presence of a K flux.

Twelfth Embodiment

Figure 20:
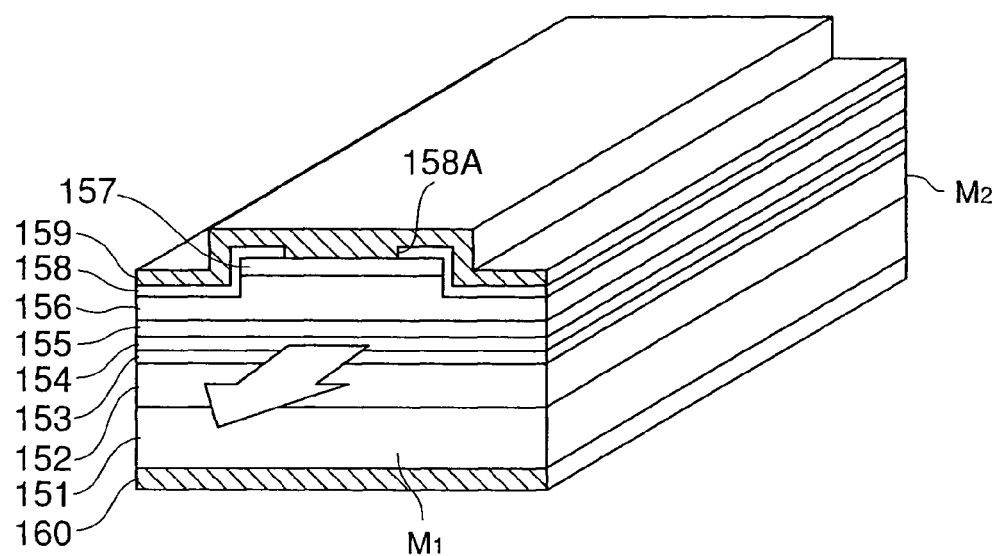
FIG. 20 is a diagram showing the construction of a laser diode having a GaN bulk crystal substrate according to a twelfth embodiment of the present invention.

FIG. 20 shows the construction of a laser diode 150 of edge-emission type according to a twelfth embodiment of the present invention.

Referring to FIG. 20, the laser diode 150 is constructed on a GaN bulk crystal substrate 151 produced in any of the process explained before. More specifically, the GaN bulk crystal substrate 151 has a high crystal quality characterized by a defect density of $10^2$-$10^3$ cm$^{-2}$ or less.

On the GaN bulk crystal substrate 151, there is provided a lower cladding layer 152 of n-type AlGaN epitaxially with respect to the substrate 151 and an optical waveguide layer 153 of n-type GaN is formed on the lower cladding layer 152 epitaxially.

On the optical waveguide layer 153, there is provided an active layer 154 of MQW structure including an alternate stacking of quantum well layers of undoped InGaN having a composition represented as $In_xGa_{1-x}N$ (x=0.15) and barrier layers of undoped InGaN having a composition represented as $In_yGa_{1-y}N$ (y=0.02). The active layer 154 is covered by an optical waveguide layer 155 of p-type GaN, and an upper cladding layer 156 of p-type AlGaN is formed epitaxially on the optical waveguide layer 155. Further, a contact layer 157 of p-type GaN is formed on the upper cladding layer 156.

The contact layer 157 and the underlying upper cladding layer 156 are subjected to a patterning process to form a loss-guide structure extending in the axial direction of the laser diode 150 and the loss-guide structure thus formed is covered by an $SiO_2$ film 158. The SiO2 film 158 is formed with an opening 158A extending in the laser axial direction for exposing the contact layer 157, and a p-type electrode 159 is provided on the $SiO_2$ film 158 in contact with the contact layer 157 at the opening 158A.

Further, an n-type electrode 160 is provided at a bottom surface of the GaN bulk crystal substrate 151.

After forming the laser structure as such, the layered semiconductor body including the GaN substrate 151 and the epitaxial layers 151-157 is subjected to a cleaving process to form mirror surfaces M1 and M2 defining an optical cavity. Thereby, the laser diode produces a blue to ultraviolet optical beam as a result of stimulated emission and optical amplification occurring in the optical cavity, as represented in FIG. 20 by an arrow.

Figure 1:
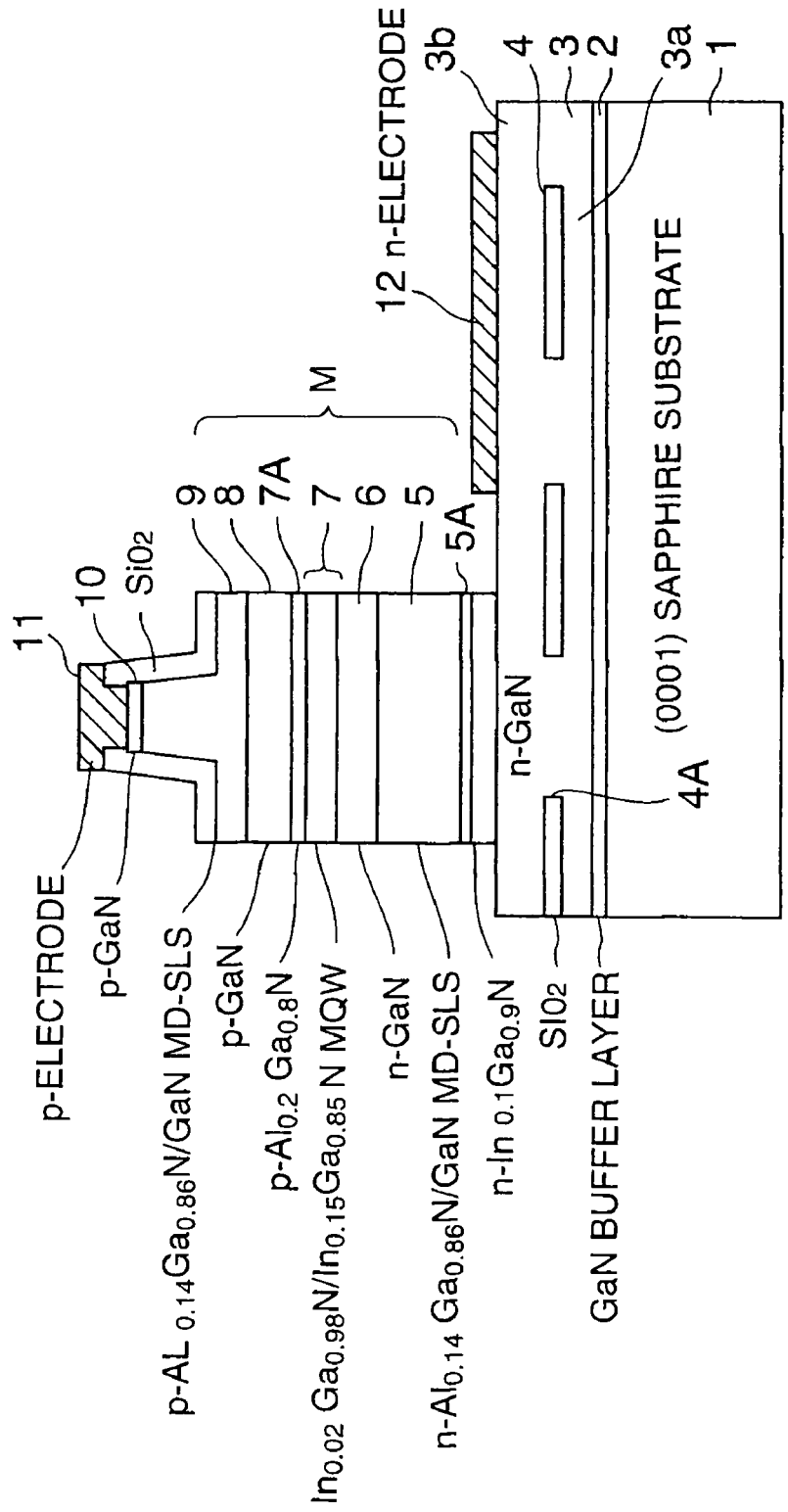
FIG. 1 is a diagram showing the construction of a conventional laser diode constructed on a sapphire substrate.
Figure 2:
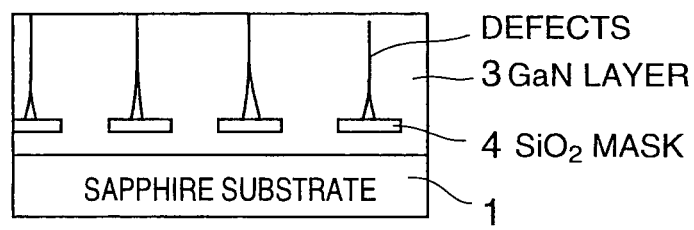
FIG. 2 is a diagram showing the problem associated with the laser diode of FIG. 1.

According to the present invention, the optical cavity is formed by a simple cleaving process and the quality of the mirror surfaces M1 and M2 defining the optical cavity is improved substantially. Thereby, threshold of laser oscillation is lowered substantially. Further, the laser diode 150 carries the n-type electrode on the bottom surface of the GaN bulk crystal substrate 151 and the process of fabricating the laser diode is improved substantially. As the epitaxial layers, particularly the GaN optical waveguide layers 153 and 155 and the active layer 154 sandwiched between the layer 153 and 155 are formed epitaxially on the GaN bulk crystal substrate containing only a very small amount of defects, the quality of the crystal constituting the foregoing layers 153-155 is improved substantially over the conventional laser diode of FIG. 1 and the laser diode 150 of FIG. 20 can be driven with a large power. Further, the laser diode 150 of the present embodiment has an improved lifetime over the conventional laser diode of FIG. 1.

It should be noted that the GaN bulk crystal substrate 151 may be any of the hexagonal type or cubic type. In view of the easiness of cleaving process, on the other hand, it is preferable to form the GaN bulk crystal substrate 151 according to the process of the eleventh embodiment by using a K flux.

Based on the structure of FIG. 20, it is also possible to construct a light-emitting diode. Further, it is possible to construct a vertical cavity laser diode, which produces a laser beam in a direction vertical to the epitaxial layers, also by using the GaN bulk crystal substrate of the present invention.

In the case of a vertical cavity laser diode, a pair of mirror surfaces defining an optical cavity are formed by the epitaxial layers on the GaN bulk crystal substrate 151, and an optical window is formed in the electrode 159. In such a case, the GaN substrate 151 may have a thickness larger than 100 μm such as 300 μm or more.

In the laser diode of FIG. 20, it is also possible to form the mirror surfaces M1 and M2 by a dry etching process.

Thirteenth Embodiment

Figure 21:
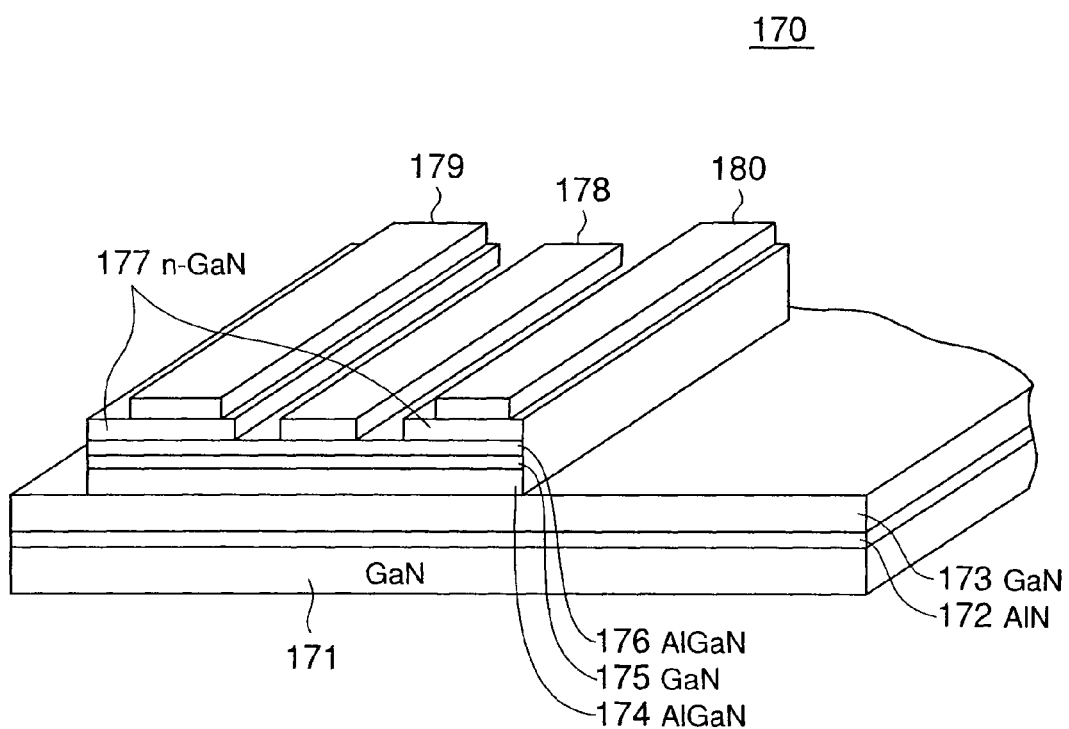
FIG. 21 is a diagram showing the construction of a HEMT having a GaN bulk crystal substrate according to a thirteenth embodiment of the present invention.

FIG. 21 shows the construction of an electron device 170 constructed on a GaN bulk crystal substrate 171 according to a thirteenth embodiment of the present invention.

Referring to FIG. 21, the electron device 170 is an FET, and the GaN bulk crystal 102B of any of the foregoing first through twelfth embodiments is used for the GaN substrate 171.

On the substrate 171, there is provided a high-resistance epitaxial layer 172 of AlN, and a buffer layer 173 of undoped GaN is formed epitaxially on the AlN high-resistance layer 172.

On the buffer layer 173, a lower barrier layer 174 of undoped AlGaN is formed epitaxially, and a channel layer 175 of undoped GaN is formed on the lower barrier layer 174 such that the channel layer 175 is sandwiched between the lower barrier layer 174 and an upper barrier layer 176 of undoped AlGaN formed epitaxially on the channel layer 175.

The upper barrier layer 176 is covered by a contact layer 177 of n-type GaN wherein the layers 174-177 are patterned to form a mesa region for device isolation. Further, the contact layer 177 is patterned to expose the upper barrier layer 176 in correspondence to the channel region, and a Schottky electrode 178 of a Ni/Au structure is provided in contact with the exposed upper barrier layer 176 as the gate electrode. Further, ohmic electrodes 179 and 180 of a Ti/Al structure are formed on the contact layer 177 at both lateral sides of the gate electrode 178 as a source electrode and a drain electrode, respectively.

In operation, a two-dimensional electron gas is induced in the channel layer 175 in response to application of a gate voltage to the gate electrode 178. In this state, the FET is turned on.

According to the present invention, it is thus possible to construct an active device such as an FET on a GaN substrate, by using the GaN bulk crystal for the substrate. As the GaN bulk crystal produced according to the present invention has an high crystal quality characterized by a defect density of $10^2$-$10^3$ cm$^{-2}$ or less, the problem of severe leakage current that would occur when an FET is constructed on a conventional GaN epitaxial layer formed on a sapphire substrate or an SiC substrate, is successfully eliminated. Further, the construction of FIG. 21 is advantageous in view of the fact that the electron density of the two-dimensional electron gas induced in the channel layer 175 is increased due to enhanced piezoelectric effect and associated increase of degree of electron confinement into the channel layer. When the channel layer contains a high concentration of defects, there occurs a lattice relaxation and the effect of carrier confinement is degraded inevitably.

Further, the GaN bulk crystal of the present invention can be used also as the GaN substrate of other various electron devices including a HEMT, MESFET and an HBT. In fact, the structure of FIG. 21 can be modified to form a HEMT by employing an n-type AlGaN layer for the upper barrier layer 176.

Further, the present invention is by no means limited to the embodiments described heretofore, but various variations and modifications may be made without departing from the scope of the invention.

What is claimed is:

1. A method of producing a single crystal body of a group III nitride, comprising:
   forming a molten flux of an alkali metal element in a pressurized reaction vessel confining therein said molten flux together with an atmosphere containing N (nitrogen), such that said molten flux contains a group III element in addition to said alkali metal element;
   disposing a seed crystal composed of a nitride of the group III element, increasing a pressure in said reaction vessel, and growing a nitride of said group III element in the form of a single crystal body having a size of 1 cm or more in said molten flux contained in the reaction vessel while holding a temperature and the increased pressure in the reaction vessel; and
   supplying a compound containing N directly into the atmosphere in said reaction vessel from a source located outside said reaction vessel during a growth of said single crystal body, said compound containing N being a source material of said single crystal body of the group III nitride,
   wherein said step of growing said single crystal body of nitride comprises the step of disposing the seed crystal in said reaction vessel.

2. The method as claimed in claim 1, wherein said step of growing said single crystal body of nitride comprises the step of contacting said seed crystal with said molten flux.

3. The method as claimed in claim 1, wherein said seed crystal comprises a group III nitride.

4. The method as claimed in claim 1, wherein said alkali metal element includes Na.

5. The method as claimed in claim 1, wherein said alkali metal element includes K.

6. The method as claimed in claim 1, wherein said group III element comprises Ga.

7. The method as claimed in claim 1, said molten flux includes Ga and K.

8. The method as claimed in claim 1, further comprising:
   contacting the seed crystal with said molten flux; and
   pulling up said seed crystal from said molten flux in an upward direction with a growth of said single crystal body on said seed crystal.

9. The method as claimed in claim 8, further comprising:
   providing a rod configured for carrying said seed crystal at a tip end thereof and providing a motor for moving said rod in an upward direction, above a melt surface of said molten flux formed in said reaction vessel.

10. The method as claimed in claim 9, further comprising:
    providing a cover member for covering a surface of said molten flux formed in said reaction vessel, said cover member having a central opening for allowing said seed crystal to make contact with said molten flux.

11. The method as claimed in claim 1, further comprising:
    supplying continuously a compound containing N in an amount to compensate for a depletion of N in the atmosphere as a result of growing said single crystal body.

12. The method as claimed in claim 1, further comprising:
    regulating the pressure inside the reaction vessel to a value of approximately 5 Megapascals (MPa) by controlling a regulator valve through which the compound containing N is supplied to the reaction vessel from an external source.

13. The method as claimed in claim 1, wherein said single crystal body of nitride grown by performing said method has a defect density of $10^3$ cm$^{-2}$ or less.

14. The method of claim 1, wherein said method further comprises the step of supplying from an external source a vapor of an alkali metal element directly into the atmosphere in said reaction vessel.

15. The method of claim 1, wherein said method further comprises the step of supplying from an external source a vapor of an alkali metal element directly into the atmosphere in said reaction vessel, and
    wherein supplying of the vapor of the alkali metal element is performed continuously during the growth of said single crystal body.

16. The method of claim 1, further comprising:
heating a molten alkali metal element in a container located outside the pressurized reaction vessel to generate a vapor of an alkali metal element; and
supplying from the container the vapor of the alkali metal element directly into the atmosphere in said reaction vessel.

17. The method of claim 1, wherein said method further comprises the step of supplying from an external source a vapor of an alkali metal element directly into the atmosphere in said reaction vessel, and
wherein said vapor of the alkali metal element is supplied selectively to an area of the pressurized reaction vessel where said growth of said single crystal body takes place.

18. A method of producing a single crystal body of a group III nitride, said method comprising:
forming a molten flux of an alkali metal element in a pressurized reaction vessel confining therein said molten flux together with an atmosphere containing N (nitrogen), such that said molten flux contains a group III element in addition to said alkali metal element;
disposing a seed crystal composed of a nitride of the group III element, and growing a nitride of said group III element in the form of a single crystal body in said molten flux;
supplying a compound containing N directly into the atmosphere in said reaction vessel from a source located outside said reaction vessel during a growth of said single crystal body, said compound containing N being a source material of said single crystal body of the group III nitride;
wherein said step of growing said single crystal body of nitride comprises the step of disposing the seed crystal in said reaction vessel;
contacting the seed crystal with said molten flux; and
pulling down said seed crystal into said molten flux in a downward direction with a growth of said single crystal body on said seed crystal.

19. The method as claimed in claim 18, further comprising:
inserting a rod configured for carrying a seed crystal at a tip end thereof, into said reaction vessel through a bottom part of said reaction vessel; and
providing a motor outside of said reaction vessel for moving said rod in a downward direction.

* * * * *